(12) United States Patent
Koo et al.

(10) Patent No.: US 10,461,218 B2
(45) Date of Patent: Oct. 29, 2019

(54) SEMICONDUCTOR DEVICE

(71) Applicant: LG INNOTEK CO., LTD., Seoul (KR)

(72) Inventors: Ji Hyun Koo, Seoul (KR); Dae Hee Lee, Seoul (KR); Jung Wook Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/772,907

(22) PCT Filed: Nov. 3, 2016

(86) PCT No.: PCT/KR2016/012614
§ 371 (c)(1),
(2) Date: May 2, 2018

(87) PCT Pub. No.: WO2017/078441
PCT Pub. Date: May 11, 2017

(65) Prior Publication Data
US 2018/0323341 A1 Nov. 8, 2018

(30) Foreign Application Priority Data

Nov. 3, 2015 (KR) .................. 10-2015-0154113
Aug. 5, 2016 (KR) .................. 10-2016-0100287

(51) Int. Cl.
*H01L 33/14* (2010.01)
*H01L 33/02* (2010.01)
(Continued)

(52) U.S. Cl.
CPC ............ *H01L 33/145* (2013.01); *H01L 33/02* (2013.01); *H01L 33/14* (2013.01); *H01L 33/22* (2013.01);
(Continued)

(58) Field of Classification Search
CPC ........ H01L 33/02; H01L 33/14; H01L 33/22; H01L 33/36; H01L 33/38; H01L 33/44; H01L 33/48; H01L 33/145; H01L 33/405
See application file for complete search history.

(56) References Cited

U.S. PATENT DOCUMENTS

2013/0161674 A1   6/2013  Itonaga
2014/0110737 A1*  4/2014  Matsumura ........... H01L 33/382
                                                        257/98
(Continued)

FOREIGN PATENT DOCUMENTS

KR       2010-171193 A      8/2010
KR    10-2012-0031340 A     4/2012
(Continued)

OTHER PUBLICATIONS

Machine Translated Document (Year: 2012).*
International Search Report (PCT/ISA/210) issued in PCT/KR2016/012614, dated Feb. 23, 2017.

*Primary Examiner* — Ahmed N Sefer
(74) *Attorney, Agent, or Firm* — Birch, Stewart, Kolasch & Birch, LLP

(57) ABSTRACT

A semiconductor device according to an embodiment includes: a light emitting structure including a first conductive semiconductor layer, an active layer under the first conductive semiconductor layer, a second conductive semiconductor layer under the active layer, and a plurality of recesses exposing a lower portion of the first conductive semiconductor layer; at least one pad arranged outside the light emitting structure and arranged to be adjacent to at least one edge; and a plurality of insulation patterns arranged in the recesses and extending to a lower surface of the light emitting structure, in which widths of the plurality of insulation patterns are reduced as the insulation patterns become further away from the pad. The semiconductor device according to the embodiment may prevent a current from being focused on a recess area adjacent to the pad.

19 Claims, 19 Drawing Sheets

(51) Int. Cl.
  *H01L 33/22*  (2010.01)
  *H01L 33/36*  (2010.01)
  *H01L 33/38*  (2010.01)
  *H01L 33/48*  (2010.01)
  *H01L 33/40*  (2010.01)
  *H01L 33/44*  (2010.01)

(52) U.S. Cl.
  CPC .............. *H01L 33/36* (2013.01); *H01L 33/38* (2013.01); *H01L 33/382* (2013.01); *H01L 33/405* (2013.01); *H01L 33/48* (2013.01); *H01L 33/44* (2013.01)

(56) References Cited

U.S. PATENT DOCUMENTS

| | | | |
|---|---|---|---|
| 2015/0280071 A1 | 10/2015 | Takenaga et al. | |
| 2017/0084777 A1* | 3/2017 | Pfeuffer | H01L 33/0079 |
| 2018/0151778 A1* | 5/2018 | Park | H01L 33/36 |
| 2018/0301597 A1* | 10/2018 | Park | H01L 33/60 |

FOREIGN PATENT DOCUMENTS

| | | | |
|---|---|---|---|
| KR | 2012-0031339 | * | 4/2012 |
| KR | 10-2012-0081333 A | | 7/2012 |
| KR | 2013-135185 A | | 7/2013 |
| KR | 10-2015-0007854 A | | 1/2015 |

\* cited by examiner

Fig. 18
| CURRENT | RELATED ART | EMBODIMENT |
|---|---|---|
| 350mA | 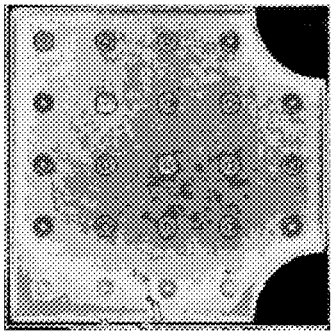 | 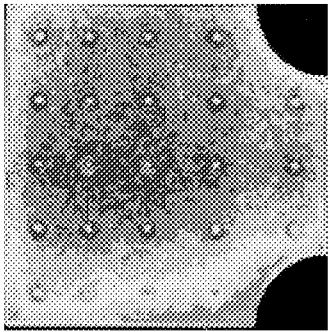 |
| 100mA | 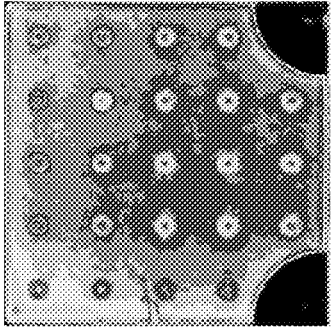 | 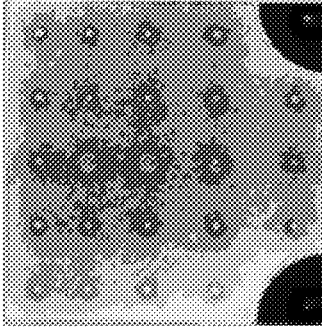 |
Fig. 19
|  | RELATED ART | | EMBODIMENT | |
|---|---|---|---|---|
| IF (mA) | 350 | 1500 | 350 | 1500 |
| VF (V) | 2.97 | 3.40 | 2.97 | 3.42 |
| Po (mV) | 559.8 | 1987.3 | 562.6 | 1995.2 |
| ΔPo (%) | 355.0% | | 354.6% | |

SEMICONDUCTOR DEVICE

CROSS REFERENCE TO RELATED APPLICATIONS

This application is the National Phase of PCT International Application No. PCT/KR2016/012614, filed on Nov. 3, 2016, which claims priority under 35 U.S.C. 119(a) to Patent Application Nos. 10-2015-0154113, filed in the Republic of Korea on Nov. 3, 2015, and 10-2016-0100287, filed in the Republic of Korea on Aug. 5, 2016, all of which are hereby expressly incorporated by reference into the present application.

BACKGROUND

Embodiments relate to a semiconductor device, and more particularly, to a semiconductor device for improving light efficiency.

A semiconductor device including a compound such as GaN and AlGaN has various advantages such as wide and adjustable band gap energy, and thus may be variously used as a light emitting element, a light receiving element, various diodes, and the like.

In particular, the light emitting element such as a light emitting diode and a laser diode using group 3-5 or group 2-6 compound semiconductor materials may implement various colors such as red, green, blue, and ultraviolet rays with development of a thin film growth technique and a device material, may also implement an efficient white ray by using fluorescent materials or combining colors, and has advantages such as low power consumption, a semipermanent lifespan, a fast response speed, safety, and environmental friendliness, as compared to the existing light source such as a fluorescent lamp and an incandescent lamp.

In addition, when the light receiving element such as a photo-detector and a solar cell is manufactured using group 3-5 or group 2-6 compound semiconductor materials, the light receiving element generates a photocurrent by absorbing light beams having various wavelengths with development of a device material, and thus may use light beams having various wavelengths ranging from gamma rays to radio waves. Also, the light receiving element has advantages such as a fast response speed, safety, environmental friendliness, and easy adjustment of a device material, and thus may be also easily used for power control, a microwave circuit, or a communication module.

Thus, the semiconductor device has been widely applied to a transmission module of an optical communication means, a light emitting diode backlight unit replacing a cold cathode fluorescence lamp (CCFL) constituting a backlight unit of a liquid crystal display (LCD) device, a white light emitting diode lighting device replacing a fluorescent lamp and an incandescent lamp, a head lamp for a vehicle, a traffic light, a sensor configured to detect gas or fire, and the like. Also, the semiconductor device may be extensively applied to a high frequency application circuit, other power control devices, and a communication module.

In particular, high output is required for the semiconductor device provided in the head lamp for the vehicle. Accordingly, the semiconductor device generates a high current to implement a high output lamp. Accordingly, in the semiconductor device, a current and heat are focused on an area adjacent to a pad to shorten a lifespan of an active layer region, thereby causing deterioration of reliability.

SUMMARY

Embodiments provide a semiconductor device which prevents a current from being focused on an area adjacent to a pad, thereby improving electrical characteristics.

A semiconductor device according to an embodiment may include a light emitting structure including a first conductive semiconductor layer, an active layer under the first conductive semiconductor layer, a second conductive semiconductor layer under the active layer, and a plurality of recesses through which a lower portion of the first conductive semiconductor layer is exposed, at least one pad arranged outside the light emitting structure, and arranged to be adjacent to at least one edge, and a plurality of insulation patterns arranged inside the recesses and extending to a lower surface of the light emitting structure, wherein widths of the plurality of insulation patterns are reduced as the insulation patterns become further away from the pad.

Further, a semiconductor device according to an embodiment may include a light emitting structure including a first conductive semiconductor layer, a second conductive semiconductor layer, an active layer arranged between the first conductive semiconductor layer and the second conductive semiconductor layer, and a plurality of recesses extending from the second conductive semiconductor layer via the active layer to a part of the first conductive semiconductor layer, first electrodes arranged inside the plurality of recesses and electrically connected to the first conductive semiconductor layer, second electrodes electrically connected to the second conductive semiconductor layer; and a pad portion including a first pad and a second pad electrically connected to the second electrodes, wherein a first group of recesses among the plurality of recesses are spaced apart from each other between the first pad and the second pad by a first interval in a first direction connecting the first pad and the second pad, a second group of recesses among the plurality of recesses are arranged in the first direction to be spaced apart from each other by a second interval that is larger than the first interval in a second direction that is perpendicular to the first direction in the first group of recesses, and a third group of recesses among the plurality of recesses are arranged in the first direction to be spaced apart from each other by a third interval that is smaller than the first interval in the second direction in the second group of recesses.

Further, a semiconductor device according to an embodiment may include a light emitting structure including a first conductive semiconductor layer, a second conductive semiconductor layer, an active layer arranged between the first conductive semiconductor layer and the second conductive semiconductor layer, and a plurality of recesses extending from the second conductive semiconductor layer via the active layer to a part of the first conductive semiconductor layer, first electrodes arranged inside the plurality of recesses and electrically connected to the first conductive semiconductor layer, second electrodes electrically connected to the second conductive semiconductor layer; and a pad electrically connected to the second electrodes, a first group of recesses among the plurality of recesses are arranged to be adjacent to the pad in a first direction and a second direction that is perpendicular to the first direction at a first interval, and a second group of recesses among the plurality of recesses are arranged in a third direction between the first direction and the second direction at an interval that is smaller than the first interval in the first group of recesses.

A semiconductor device according to an embodiment may prevent a current from being focused on a recess area adjacent to a pad.

Also, the semiconductor device according to the embodiment may improve heat generation characteristics, thereby improving a lifespan and reliability.

Also, the semiconductor device according to the embodiment may reduce heat dissipation costs due to a reduction in a temperature.

Also, the semiconductor device according to the embodiment may control the thickness of a current blocking layer surrounding a recess to prevent a current from being focused on a recess area adjacent to a pad.

Also, the semiconductor device according to the embodiment may determine the thickness according a distance between recesses to maximize coupling between an electron and a hole so as to maximize light efficiency of the semiconductor device.

BRIEF DESCRIPTION OF THE DRAWINGS

Embodiments will be described in detail with reference to the following drawings in which like reference numerals refer to like elements, and wherein:

FIG. 18 is a view illustrating a comparison between a current spreading phenomenon of the semiconductor device according to the fourth embodiment and a current spreading phenomenon of a semiconductor device according to the related art;

FIG. 19 is a view illustrating an output of the semiconductor device according to the fourth embodiment and an output of the semiconductor device according to the related art;

DETAILED DESCRIPTION OF THE EMBODIMENTS

The present embodiments may be modified in other forms and various embodiments may be combined with each other. Further, the scope of the present disclosure is not limited to understood and described embodiments, which will be described below.

If there is no description contrary or contradictory to any matter in a specific embodiment, the matter may be understood to be related to other embodiment(s).

For example, when a feature of a configuration A is described in a specific embodiment and a feature of a configuration B is described in another embodiment, even when an embodiment in which the configuration A and the configuration B are coupled to each other is not explicitly described, if there is no description contrary or contradictory to the embodiment, the embodiment should be understood to belong to the scope of the right of the present disclosure.

Hereinafter, embodiments of the present disclosure, which may implement the aspects of the present disclosure in detail, will be described with reference to the accompanying drawings.

In description according to an embodiment of the present disclosure, when it is described that a first element is formed "on" or "under" a second element, "on" and under" include both a state in which two elements are directly in contact with each other or a state in which one or more other elements are interposed between two elements. Also, when "on" or "under" is expressed, "on" or "under" may mean a downward direction as well as an upward direction with respect to one element.

A semiconductor device may include various electronic devices such as a light emitting element and a light receiving element, and both the light emitting element and the light receiving element may include first conductive semiconductor layers, active layers, and second conductive semiconductor layers.

The semiconductor device according to the present embodiment may be a light emitting element.

The light emitting element emits a light beam as an electron and a hole are recombined with each other, and the wavelength of the light beam is determined by an inherent energy band gap of a material. Thus, the emitted light may differ according to the composition of the material.

Figure 1:
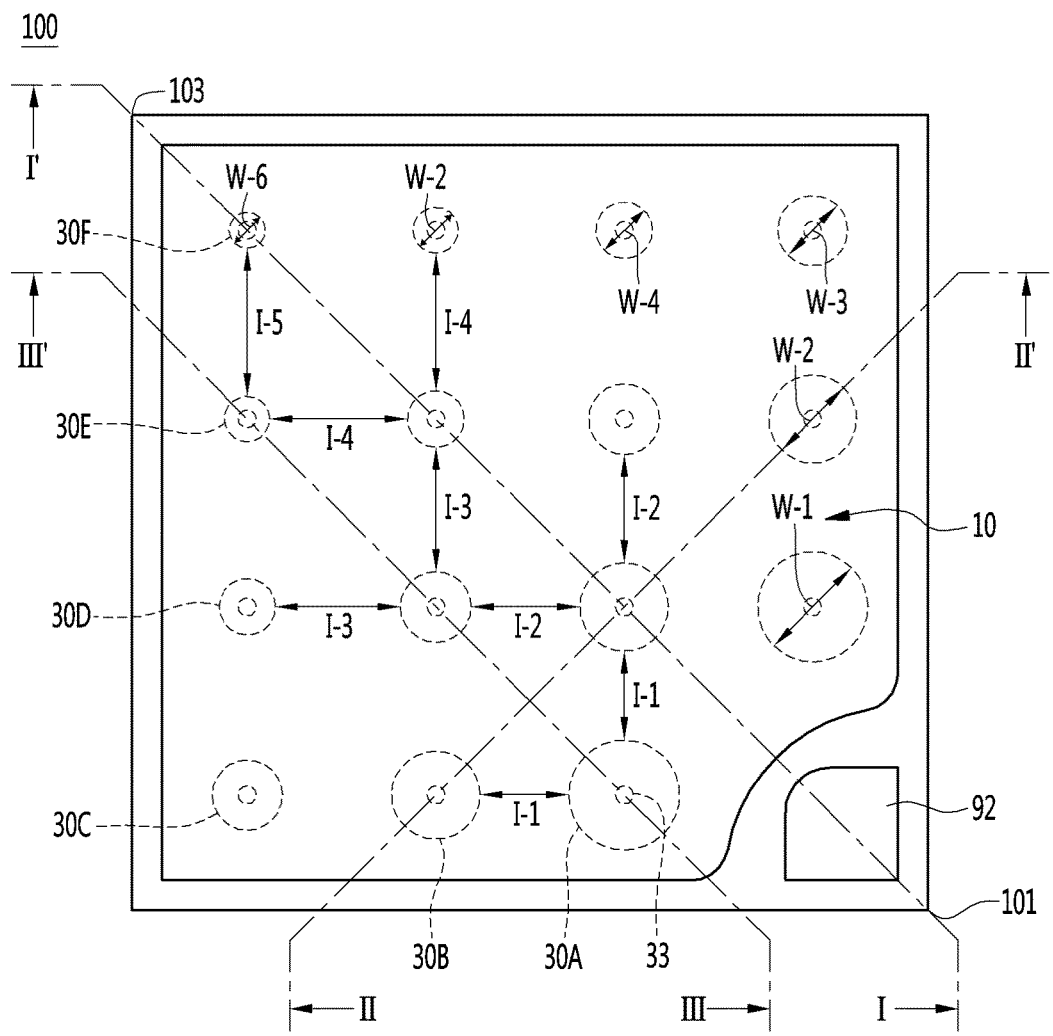
FIG. 1 is a plan view illustrating a semiconductor device according to a first embodiment.
Figure 2:
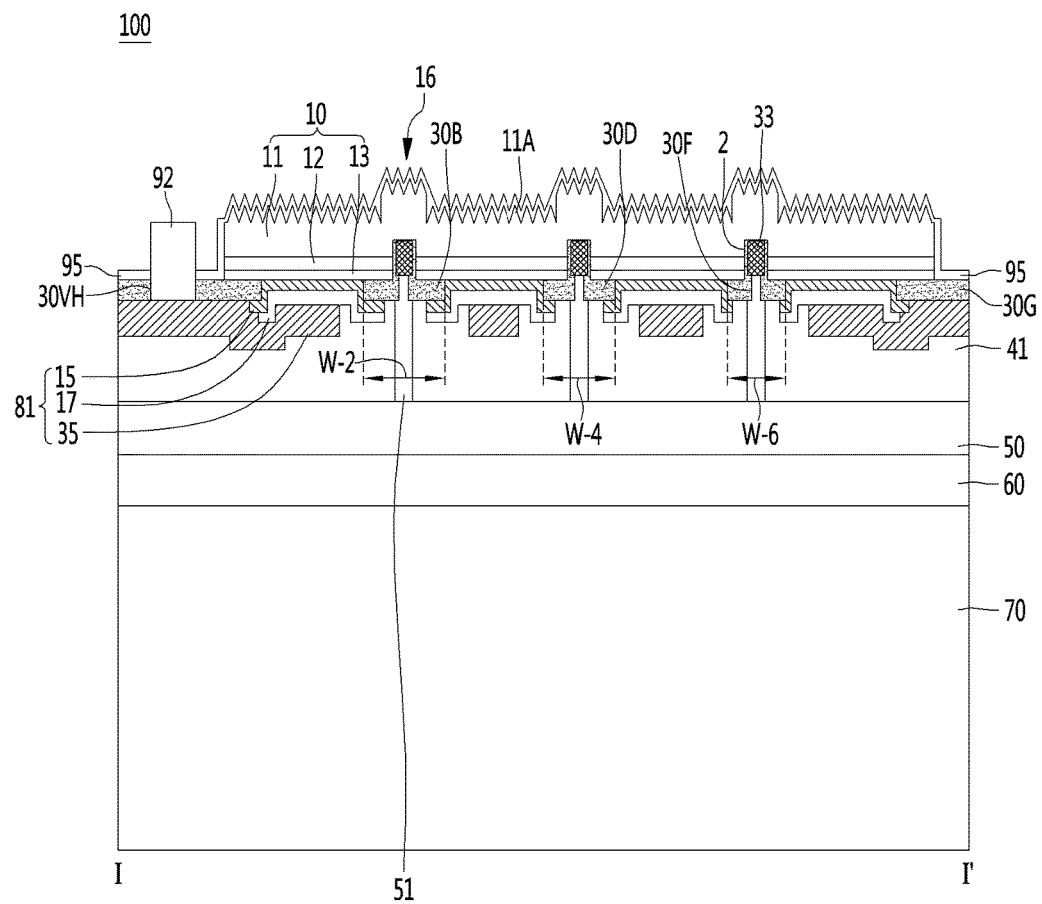
FIG. 2 is a sectional view illustrating the semiconductor device taken along line I-I' of FIG. 1.
Figure 3:
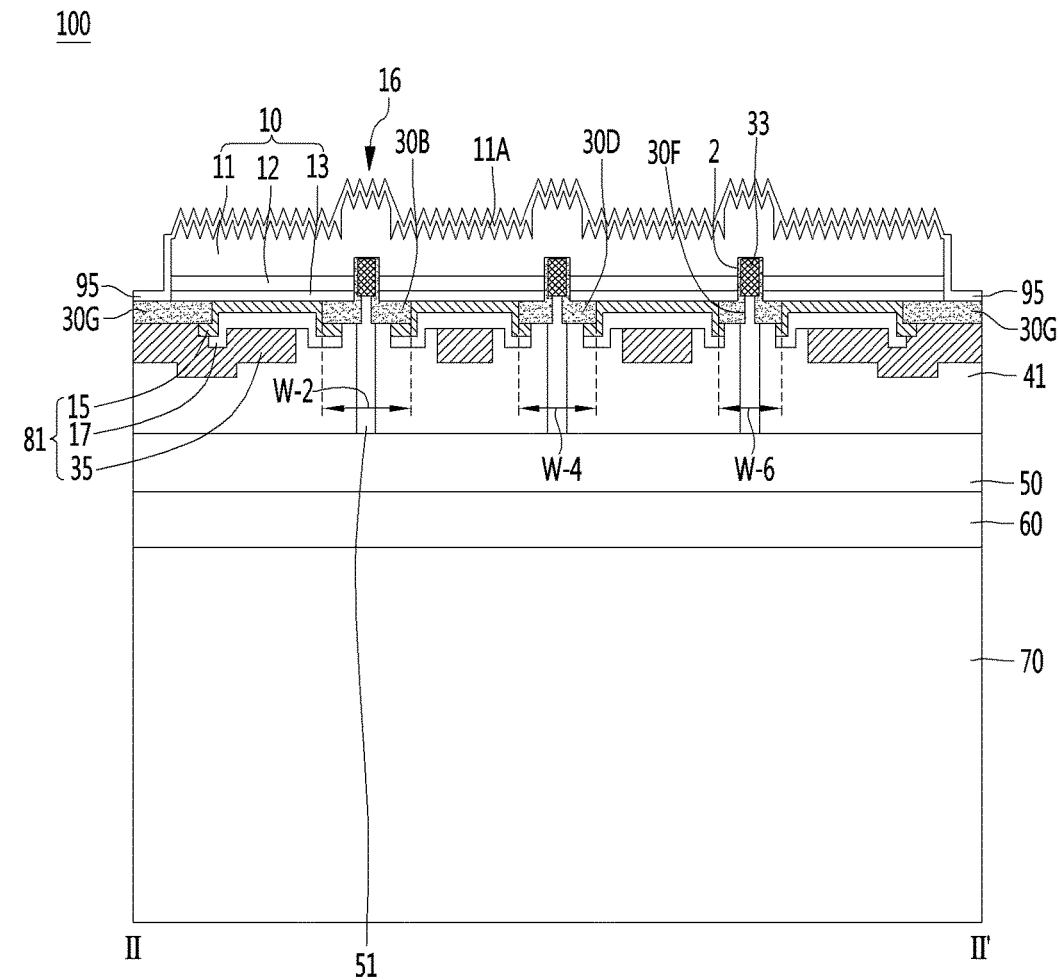
FIG. 3 is a sectional view illustrating the semiconductor device taken along line II-II' of FIG. 1.
Figure 4:
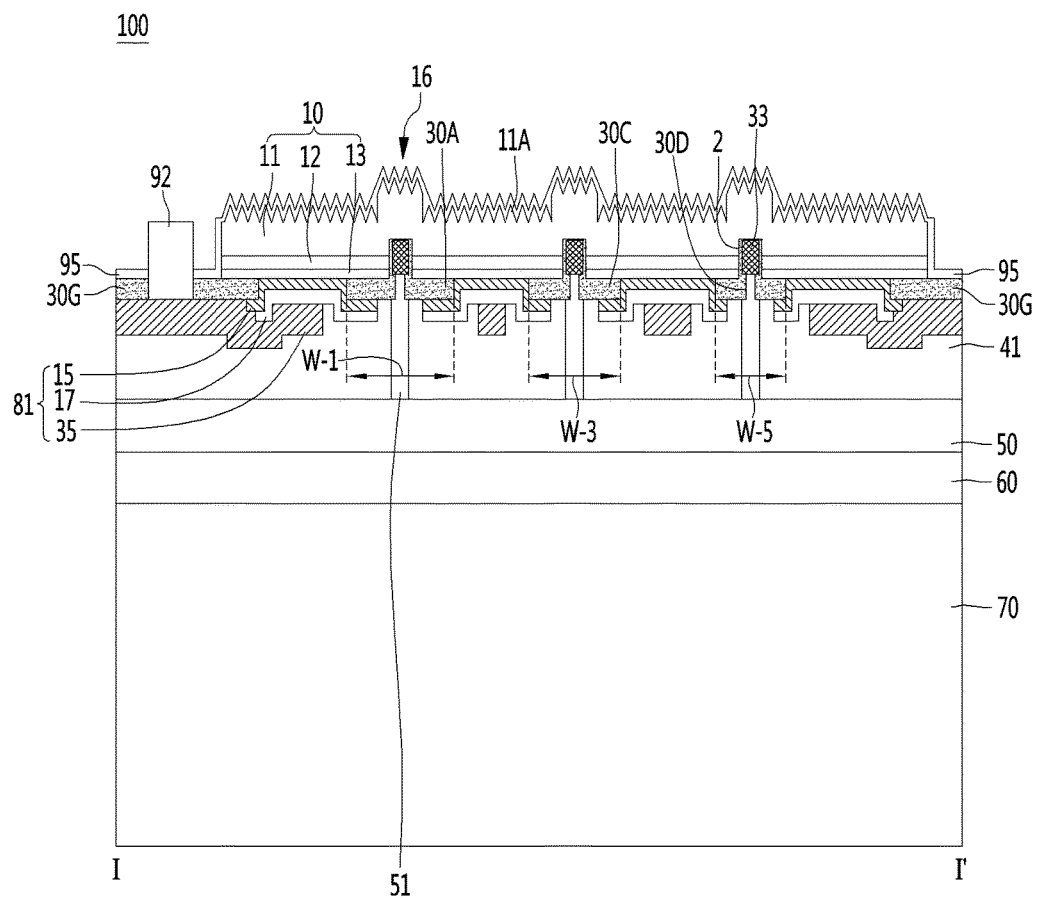
FIG. 4 is a sectional view illustrating the semiconductor device taken along line III-III' of FIG. 1.

FIG. 1 is a plan view illustrating a semiconductor device according to a first embodiment, FIG. 2 is a sectional view illustrating the semiconductor device taken along line I-I' of FIG. 1, FIG. 3 is a sectional view illustrating the semiconductor device taken along line II-II' of FIG. 1, and FIG. 4 is a sectional view illustrating the semiconductor device taken along line III-III' of FIG. 1.

As illustrated in FIGS. 1 to 4, a semiconductor device 100 according to an embodiment may include a light emitting structure 10, a pad 92, a passivation layer 95, and first and second electrodes 81 and 33.

The light emitting structure 10 may include a first conductive semiconductor layer 10, an active layer 12 located under the first conductive semiconductor layer 11, and a second conductive semiconductor layer 13 located under the active layer 12.

The first conductive semiconductor layer 11 may be implemented using a semiconductor compound, for example, a group-group and group-group compound semiconductor. The first conductive semiconductor layer 11 may be formed in a single layer or multiple layers. The first conductive semiconductor layer 11 may be doped with a first conductive dopant. For example, when the first conductive semiconductor layer 11 is an n-type semiconductor layer, the first conductive semiconductor layer 11 may include an n-type dopant. For example, although the n-type dopant may include Si, Ge, Sn, Se, and Te, the present disclosure is not limited thereto. Although the first conductive semiconductor layer 11 may include a semiconductor material having a composition formula of $In_xAl_yGa_{1-x-y}N$ (0=x=1, 0=y=1, 0=x+y=1), the present disclosure is not limited thereto. For example, the first conductive semiconductor layer 11 may be selected from GaN, AlN, AlGaN, InGaN, InN, InAlGaN, AlInN, AlGaAs, GaP, GaAs, GaAsP, AlGaInP, and the like.

The first conductive semiconductor layer 11 may include an uneven structure 11A formed on an upper surface thereof. Although the uneven structure 11A may have a cross section having peaks and valleys, the present disclosure is not limited thereto. Further, the uneven structure 11A may be formed to have a polygonal shape or a shape having a curvature. The uneven structure 11A may improve light extraction efficiency.

The first conductive semiconductor layer 11 may include a plurality of protrusions 16. The protrusions 16 may be arranged at regular intervals. Although the uneven structure 11A may be arranged on upper surfaces of the protrusions 16, the present disclosure is not limited thereto. The protrusions 16 may protrude upwardly of the first conductive semiconductor layer 11. The protrusions 16 may secure the thickness of the first conductive semiconductor layer 11 overlapping with the second electrodes 33 electrically connected to a support member 70, thereby improving a current focused around the second electrodes 33. The protrusions 16 may be formed through an etching process. For example, the protrusions 16 may be formed by etching the upper surface of the first conductive semiconductor layer 11 except for an area overlapping with the second electrodes 33.

The active layer 12 may be arranged under the first conductive semiconductor layer 11. The active layer 12 may selectively include a single quantum well, a multiple quantum well (MQW), a quantum wire structure, or a quantum dot structure. The active layer 12 may be formed of a compound semiconductor. The active layer 12 may be implemented in at least one of, for example, a group-group and group-group compound semiconductor.

When the active layer 12 is implemented in a MQW structure, quantum wells and quantum walls may be arranged alternately. The quantum wells and the quantum walls may be a semiconductor material having a composition formula of $In_xAl_yGa_{1-x-y}N$ (0≤x≤1, 0≤y≤1, 0≤x+y≤1). For example, although the active layer 12 may be formed in one or more pair structures of InGaN/GaN, InGaN/AlGaN, InGaN/InGaN, InAlGaN/InAlGaN, GaN/AlGaN, InAlGaN/GaN, GaInP/AlGaInP, GaP/AlGaP, InGaP/AlGaP, GaAs/AlGaAs, and InGaAs/AlGaAs, the present disclosure is not limited thereto.

The second conductive semiconductor layer 13 may be arranged under the active layer 12. The second conductive semiconductor layer 13 may be implemented using a semiconductor compound, for example, a group-group and group-group compound semiconductor. The second conductive semiconductor layer 13 may be formed in a single layer or multiple layers. The second conductive semiconductor layer 13 may be doped with a second conductive dopant. For example, when the second conductive semiconductor layer 13 is a p-type semiconductor layer, the second conductive semiconductor layer 13 may include a p-type dopant. For example, although the p-type dopant may include Mg, Zn, Ca, Sr, Ba, and the like, the present disclosure is not limited thereto. Although the second conductive semiconductor layer 13 may include a semiconductor material having a composition formula of $In_xAl_yGa_{1-x-y}N$ (0=x=1, 0=y=1, 0=x+y=1), the present disclosure is not limited thereto. For example, the second conductive semiconductor layer 13 may be selected from GaN, AlN, AlGaN, InGaN, InN, InAlGaN, AlInN, AlGaAs, GaP, GaAs, GaAsP, AlGaInP, and the like.

Although the light emitting structure 10 has been described such that the first conductive semiconductor layer 11 corresponds to an n-type semiconductor layer and the second conductive semiconductor layer 13 corresponds to a p-type semiconductor layer, the first conductive semiconductor layer 11 may be formed in the p-type semiconductor layer and the second conductive semiconductor layer 13 may be formed in an n-type semiconductor layer. The present disclosure is not limited thereto. A semiconductor having a polarity that is opposite to that of the second conductive semiconductor layer 13, for example, an n-type semiconductor layer (not illustrated) may be formed on the second conductive semiconductor layer 13. Accordingly, the light emitting structure 10 may be implemented in one of an n-p junction structure, a p-n junction structure, an n-p-n junction structure, and a p-n-p junction structure.

The first electrodes 81 may be arranged under the light emitting structure 10. The first electrodes 81 may be arranged between the light emitting structure 10 and the support member 70. The first electrodes 81 may be electrically connected to the first conductive semiconductor layer 11. The first electrodes 81 may be electrically isolated from the second electrodes 33. Each of the first electrodes 81 may include a contact layer 15, a reflective layer 17, and a capping layer 35.

The contact layer 15 may be arranged under the first conductive semiconductor layer 11. The contact layer 15 may be directly in contact with the first conductive semiconductor layer 11. The contact layer 15 may be arranged between the first conductive semiconductor layer 11 and the reflective layer 17. The contact layer 15 may be electrically connected to the first conductive semiconductor layer 11. The contact layer 15 may be formed of conductive oxide, conductive nitride, or metal. For example, the contact layer 15 may include at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, In, Au, W, Al, Pt, Ag, and Ti.

The reflective layer 17 may be arranged between the contact layer 15 and the capping layer 35. The reflective layer 17 may be electrically connected to the contact layer 15 and the capping layer 35. The reflective layer 17 may function to reflect a light beam input from the light emitting structure 10. The reflective layer 17 may reflect the light beam from the light emitting structure 10 to the outside, thereby improving light extraction efficiency. The reflective layer 17 may be formed of metal. For example, the reflective layer 17 may be formed of metal including at least one of Ag, Ni, Al, Rh, Pd, Ir, Ru, Mg, Zn, Pt, Cu, Au, and Hf, or an alloy thereof. The reflective layer 17 may have a single layer structure or a multi-layer structure formed of the metal or alloy and a transparent conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), and Antimony-Tin-Oxide (ATO).

The capping layer 35 may be arranged under the reflective layer 17. The capping layer 35 may be directly in contact with a lower surface of the reflective layer 17. The capping layer 35 may be directly in contact with a part of the contact layer 15, which is exposed from the reflective layer 17. The capping layer 35 may be arranged under the pad 92. The capping layer 35 may be electrically connected to the pad 92. The capping layer 35 may be directly in contact with a lower surface of the pad 92. The capping layer 35 may provide driving electric power supplied from the pad 92 to the light emitting structure 10. The capping layer 35 may be formed of a conductive material. For example, the capping layer 35 may include at least one of Au, Cu, Ni, Ti, Ti—W, Cr, W, Pt, V, Fe, and Mo, and may be formed to have a single layer structure or a multi-layer structure. An edge of the capping layer 35 may be arranged to be outer than an edge of the light emitting structure 10.

The second electrodes 33 may be electrically connected to the first conductive semiconductor layer 11. The second electrodes 33 may be arranged inside a recess 2. The second electrodes 33 may include at least one of Cr, V, W, Ti, Zn, Ni, Cu, Al, Au, and Mo, and may be formed to have a single layer structure or a multi-layer structure.

A diffusion prevention layer 50, a bonding layer 60, and the support member 70 may be sequentially arranged under the second electrodes 33.

The diffusion prevention layer 50 may function to prevent a material included in the bonding layer 60 from being diffused to the first electrodes 81. The diffusion prevention layer 50 may be electrically connected to the bonding layer 60 and the support member 70. The diffusion prevention layer 50 may include at least one of Cu, Ni, Ti, Ti—W, Cr, W, Pt, V, Fe, and Mo, and may be formed to have a single layer structure or a multi-layer structure.

The bonding layer 60 may be arranged under the diffusion prevention layer 50. The bonding layer 60 may be arranged between the diffusion prevention layer 50 and the support member 70. The bonding layer 60 may include barrier metal, bonding metal, or the like. For example, the bonding layer 60 may include at least one of Ti, Au, Sn, Ni, Cr, Ga, In, Bi, Cu, Ag, Nb, Pd, and Ta, and may be formed to have a single layer structure or a multi-layer structure.

The support member 70 may be a metal substrate or a carrier substrate. For example, the support member 70 may be formed of Ti, Cr, Ni, Al, Pt, Au, W, Cu, Mo, Cu—W, and a semiconductor substrate (for example, Si, Ge, GaN, GaAs, ZnO, SiC, SiGe, or the like) into which impurities are injected, and may be formed to have a single layer structure or a multi-layer structure.

The pad 92 may be arranged on the first electrode 81. The pad 92 may be electrically connected to the first electrode 81. The pad 92 may be spaced apart from the light emitting structure 10. The pad 92 may be arranged to be outer than the light emitting structure 10. The pad 92 may be arranged on the first electrode 81 located to be outer than the light emitting structure 10. The pad 92 may be arranged to be adjacent to a first edge 101 of the semiconductor device 100. The pad 92 may include at least one of Cu, Ni, Ti, Ti—W, Cr, W, Pt, V, Fe, and Mo, and may be formed to have a single layer structure or a multi-layer structure.

The semiconductor device 100 according to the embodiment may include the passivation layer 95 arranged on the light emitting structure 10. The passivation layer 95 may protect a surface of the light emitting structure 10, and may insulate the pad 92 and the light emitting structure 10 from each other. The passivation layer 95 has a refractive index that is lower than those of the materials of the semiconductor layers constituting the light emitting structure 10. Since a light beam inside the light emitting structure 10 is refracted to the passivation layer 95 having a low refractive index, total reflection occurring on an interface between the light emitting structure 10 and the passivation layer 95 is reduced, so that light extraction efficiency may be improved. For example, the passivation layer 95 may be formed of oxide or nitride. For example, the passivation layer 95 may be formed of a material selected from the group consisting of $SiO_2$, $Si_xO_y$, $Si_3N_4$, $Si_xN_y$, $SiO_xN_y$, $Al_2O_3$, $TiO_2$, and AlN.

The semiconductor device according to the embodiment may further include an insulation layer 41 configured to insulate the first electrodes 81 and the second electrodes 33 from each other. The insulation layer 41 may be arranged between the first electrodes 81 and the second electrodes 33. The insulation layer 41 may be formed of oxide or nitride. For example, the insulation layer 41 may be formed of a material selected from the group consisting of $SiO_2$, $Si_xO_y$, $Si_3N_4$, $Si_xN_y$, $SiO_xN_y$, $Al_2O_3$, $TiO_2$, and AlN.

The semiconductor device 100 according to the embodiment may include a plurality of recesses 2 electrically connecting the second electrodes 33 and the first conductive semiconductor layer 11, the second electrodes 33, and a plurality of connectors 51.

The plurality of recesses 2 may be arranged inside the light emitting structure 10. The recesses 2 may function to expose a part of the first conductive semiconductor layer 11 to electrically connect the second electrodes 33 and the first conductive semiconductor layer 11. The plurality of recesses 2 may be arranged at regular intervals. Although the widths of the recesses 2 may be the same, the present disclosure is not limited thereto.

The second electrodes 33 may be arranged inside the plurality of recesses 2. The second electrodes 33 may be electrically connected to the first conductive semiconductor layer 11 exposed from the recesses 2. The second electrodes 33 may be directly in contact with the first conductive semiconductor layer 11 exposed from the recesses 2. The second electrodes 33 may include at least one of Cr, V, W, Ti, Zn, Ni, Cu, Al, Au, and Mo, and may be formed to have a single layer structure or a multi-layer structure.

The plurality of connectors 51 may be arranged under the second electrodes 33. The plurality of connectors 51 may be electrically connected to the second electrodes 33. The plurality of connectors 51 may be connected to the support member 70 through the insulation layer 41. The plurality of connectors 51 may be directly in contact with the diffusion prevention layer 50 through the insulation layer 41. The plurality of connectors 51 may include at least one of Ti, Au, Sn, Ni, Cr, Ga, In, Bi, Cu, Ag, Nb, Pd, and Ta. The second electrodes 33 and the plurality of connectors 51 may vertically overlap with the protrusions 16.

The semiconductor device 100 according to the embodiment may include first to seventh insulation patterns 30A to 30G electrically connecting the second electrodes 33, the active layer 12, and the first conductive semiconductor layer 11. The first to seventh insulation patterns 30A to 30G may be formed of an insulation material. For example, the first to seventh insulation patterns 30A to 30G may be formed of oxide or nitride. For example, the first to seventh insulation patterns 30A to 30G may be formed of a material selected from the group consisting of $SiO_2$, $Si_xO_y$, $Si_3N_4$, $Si_xN_y$, $SiO_xN_y$, $Al_2O_3$, $TiO_2$, and AlN. Although the first to seventh insulation patterns 30A to 30G may include light transmitting materials through which light beams may pass, the present disclosure is not limited thereto.

The first to sixth insulation patterns 30A to 30F may be arranged under the plurality of recesses 2. The first to sixth insulation patterns 30A to 30F may be arranged on the lateral walls of the plurality of recesses 2. The first to sixth insulation patterns 30A to 30F may cover the light emitting structure 10 exposed to the lateral walls of the plurality of recesses 2, and may extend toward a lower surface of the light emitting structure 10. Although top views of the first to sixth insulation patterns 30A to 30F may have circular shapes, the present disclosure is not limited thereto. For example, the first to sixth insulation patterns 30A to 30F may have an elliptical shape or a polygonal shape corresponding at least a triangle or more.

The first insulation pattern 30A may be a pattern that is arranged to be closest to the pad 92, and the sixth insulation pattern 30F may be a pattern that is arranged to be farthest from the pad 92.

The first to sixth insulation patterns 30A to 30F may have different widths in a transverse direction. The widths of the first to sixth insulation patterns 30A to 30F may decrease as they become farther from the pad 92. Although top views of the first to sixth insulation patterns 30A to 30F may have circular shapes, the present disclosure is not limited thereto. When the first to sixth insulation patterns 30A to 30F have the circular shapes, the widths of the first to sixth insulation patterns 30A to 30F may be diameters. The widths of the first to sixth insulation patterns 30A to 30 F may be reduced as they go from the first edge 101 where the pad 92 is located to a second edge 103. Here, the first and second edges 101 and 103 may be arranged to face each other in a first diagonal direction X-X'. For example, the first to sixth insulation patterns 30A to 30F may have first to sixth widths W-1 to W-6, respectively. The first width W-1 of the first insulation pattern 30A may be larger than the second width W-2 of the second insulation pattern 30B. The second width W-2 of the second insulation pattern 30A may be larger than the third width W-3 of the third insulation pattern 30C. The third width W-3 of the third insulation pattern 30C may be larger than the fourth width W-4 of the fourth insulation pattern 30D. The fourth width W-4 of the fourth insulation pattern 30D may be larger than the fifth width W-5 of the fifth insulation pattern 30E. The fifth width W-5 of the fifth insulation pattern 30E may be larger than the sixth width W-6 of the sixth insulation pattern 30F. In the embodiment, the first to sixth insulation patterns have larger widths as they become closer to the pad 92, so that a current crowding phenomenon may be improved in which a current is focused on the first conductive semiconductor layer 11 and the second electrodes 33 adjacent to the pad 92. That is, in the embodiment, a contact area between the second electrodes 33 and the first electrodes 81 adjacent to the pad 92 is reduced to induce current spreading, so that a problem may be solved in which a current is focused on an area closer to the pad 92.

For example, when the first width W-1 of the first insulation pattern 30A is 100%, the second width W-2 of the second insulation pattern 30B may be 93% to 95%, the third width W-3 of the third insulation pattern 30C may be 86% to 90%, the fourth width W-4 of the fourth insulation pattern 30D may be 79% to 85%, the fifth width W-5 of the fifth insulation pattern 30E may be 72% to 80%, and the sixth width W-6 of the sixth insulation pattern 30F may be 65% to 75%. Here, although the second to sixth widths W-2 to W-6 of the second to sixth insulation patterns 30B to 30F have been described with reference to the first width W-1 of the first insulation pattern 30A, the present disclosure is not limited thereto. Each of the second to sixth widths W-2 to W-6 of the second to sixth insulation patterns 30B to 30F may be 93% to 95% of the width of the previous insulation pattern. A difference between the first width W-1 of the first insulation pattern 30A and the sixth width W-6 of the sixth insulation pattern 30F may be 35% or less. The widths of the first to sixth insulation patterns 30A to 30F may differ from each other by 2% to 8% at each predetermined separation distance. A difference between the widths of the first insulation pattern 30A and the sixth insulation pattern 30F may be 35% or less.

When differences between the widths of the first to sixth insulation patterns 30A to 30F are lower than a predetermined range, for example, a fifth interval I-5 between the fifth and sixth insulation patterns 30E and 30F is 100%, a fourth interval I-4 between the fourth and fifth insulation patterns 30D and 30E may be 94% to 97%, a third interval I-3 between the third and fourth insulation patterns 30C and 30D may be 91% to 94%, a second interval I-2 between the second and third insulation patterns 30B and 30C may be 88% to 91%, and a first interval I-1 between the first and second insulation patterns 30A and 30B may be 85% to 88%. Here, although the embodiment has been described with reference to the fifth interval I-5 between the fifth and sixth insulation patterns 30E and 30F, the present disclosure is not limited thereto. Each of the intervals between the first to sixth insulation patterns 30A to 30F may be 94% to 97% of the previous interval.

The seventh insulation pattern 30G may extend outwardly from a lower surface of the light emitting structure 10. That is, an edge of the seventh insulation pattern 30G may be arranged on a lower surface of an edge of the light emitting structure 10 and on an upper surface of an edge of the corresponding first electrode 81. The seventh insulation pattern 30G may extend outwardly from a side surface of the light emitting structure 10. The seventh insulation pattern 30G may prevent penetration of external moisture, and may reduce an impact transferred to the light emitting structure 10, and the first and second electrodes 33 during an etching process. The seventh insulation pattern 30G may include a via hole 30VH through which the capping layer 35 is exposed such that the pad 92 and the first electrodes 81 are electrically connected to each other, and the via hole 30VH may vertically overlap with the pad 92.

The semiconductor device 100 according to the embodiment includes the first to sixth insulation patterns 30A to 30F having the widths which are reduced as they become farther from the pad 92, to induce the current spreading. Accordingly, a current is prevented from being focused around the second electrodes 33 adjacent to the pad 92, so that electrical characteristics may be improved.

FIGS. 5 to 13 are views illustrating a method of manufacturing the semiconductor device according to the first embodiment.

Figure 5:
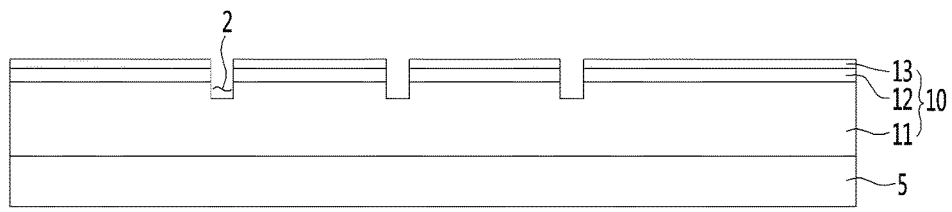
FIGS. 5 to 13 are views illustrating a method of manufacturing the semiconductor device according to the first embodiment.

Referring to FIG. 5, the light emitting structure 10 may be formed on a substrate 5.

The substrate 5 may be formed in a single layer or multiple layers. The substrate 5 may be a conductive substrate or an insulating substrate. For example, the substrate 5 may be formed of at least one of GaAs, $Al_2O_3$, SiC, Si, GaN, ZnO, GaP, InP, Ge, and $Ga_2O_3$. A cleaning process is performed before the light emitting structure 10 is formed, so that impurities may be removed from a surface of the substrate 5.

For example, although the light emitting structure 10 may be formed using a metal organic chemical vapor deposition (MOCVD) method, a chemical vapor deposition (CVD) method, a plasma-enhanced chemical vapor deposition (PECVD) method, a molecular beam epitaxy (MBE) method, a Hydride Vapor Phase Epitaxy (HVPE) method, or the like, the present disclosure is not limited thereto.

The first conductive semiconductor layer 11 may be implemented using a semiconductor compound, for example, a group-group and group-group compound semiconductor. The first conductive semiconductor layer 11 may be formed in a single layer or multiple layers. The first conductive semiconductor layer 11 may be doped with a first conductive dopant. For example, when the first conductive semiconductor layer 11 is an n-type semiconductor layer, the first conductive semiconductor layer 11 may include an n-type dopant. For example, although the n-type dopant may include Si, Ge, Sn, Se, and Te, the present disclosure is not limited thereto. Although the first conductive semiconductor layer 11 may include a semiconductor material having a composition formula of $In_xAl_yGa_{1-x-y}N$ ($0 \leq x \leq 1$, $0 \leq y \leq 1$, $0 \leq x+y \leq 1$), the present disclosure is not limited thereto. For example, the first conductive semiconductor layer 11 may be selected from GaN, AlN, AlGaN, InGaN, InN, InAlGaN, AlInN, AlGaAs, GaP, GaAs, GaAsP, AlGaInP, and the like.

The active layer 12 may be arranged under the first conductive semiconductor layer 11. The active layer 12 may selectively include a single quantum well, a multiple quantum well (MQW), a quantum wire structure, or a quantum dot structure. The active layer 12 may be formed of a compound semiconductor. The active layer 12 may be implemented in at least one of, for example, a group-group and group-group compound semiconductor. When the active layer 12 is implemented in a MQW structure, quantum wells and quantum walls may be arranged alternately. The quantum wells and the quantum walls may be a semiconductor material having a composition formula of $In_xAl_yGa_{1-x-y}N$ ($0 \leq x \leq 1$, $0 \leq y \leq 1$, $0 \leq x+y \leq 1$). For example, although the active layer 12 may be formed in one or more pair structures of InGaN/GaN, InGaN/AlGaN, InGaN/InGaN, InAlGaN/InAlGaN, GaN/AlGaN, InAlGaN/GaN, GaInP/AlGaInP, GaP/AlGaP, InGaP/AlGaP, GaAs/AlGaAs, and InGaAs/AlGaAs, the present disclosure is not limited thereto.

The second conductive semiconductor layer 13 may be arranged under the active layer 12. The second conductive semiconductor layer 13 may be implemented using a semiconductor compound, for example, a group-group and group-group compound semiconductor. The second conductive semiconductor layer 13 may be formed in a single layer or multiple layers. The second conductive semiconductor layer 13 may be doped with a second conductive dopant. For example, when the second conductive semiconductor layer 13 is a p-type semiconductor layer, the second conductive semiconductor layer 13 may include a p-type dopant. For example, although the p-type dopant may include Mg, Zn, Ca, Sr, Ba, and the like, the present disclosure is not limited thereto. Although the second conductive semiconductor layer 13 may include a semiconductor material having a composition formula of $In_xAl_yGa_{1-x-y}N$ ($0 \leq x \leq 1$, $0 \leq y \leq 1$, $0 \leq x+y \leq 1$), the present disclosure is not limited thereto. For example, the second conductive semiconductor layer 13 may be selected from GaN, AlN, AlGaN, InGaN, InN, InAlGaN, AlInN, AlGaAs, GaP, GaAs, GaAsP, AlGaInP, and the like.

Although the light emitting structure 10 has been described such that the first conductive semiconductor layer 11 corresponds to an n-type semiconductor layer and the second conductive semiconductor layer 13 corresponds to a p-type semiconductor layer, the first conductive semiconductor layer 11 may be formed in the p-type semiconductor layer and the second conductive semiconductor layer 13 may be formed in an n-type semiconductor layer. The present disclosure is not limited thereto. A semiconductor having a polarity that is opposite to that of the second conductive semiconductor layer 13, for example, an n-type semiconductor layer (not illustrated) may be formed on the second conductive semiconductor layer 13. Accordingly, the light emitting structure 10 may be implemented in one of an n-p junction structure, a p-n junction structure, an n-p-n junction structure, and a p-n-p junction structure.

The plurality of recesses 2 may be formed in the light emitting structure 10. The first conductive semiconductor layer 11 may be exposed on the bottom surfaces of the recesses, and the first conductive semiconductor layer 11, the active later 12, and the second conductive semiconductor layer 13 may be exposed to lateral walls of the recesses 2.

Figure 6:
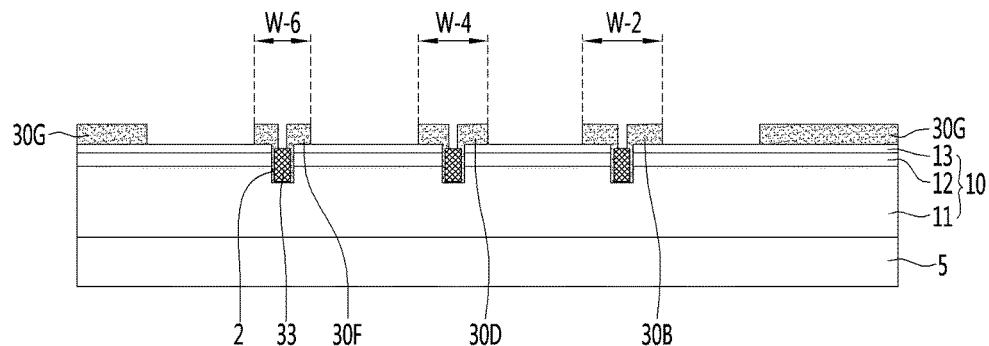

Referring to FIGS. 1 and 6, the first to seventh insulation patterns 30A to 30G and the second electrodes 33 may be formed on the light emitting structure 10.

Although the first to seventh insulation patterns 30A to 30G may be formed in pattern forms through an etching process, the present disclosure is not limited thereto. For example, the first to seventh insulation patterns 30A to 30G may be formed through a plasma damage. The first to seventh insulation patterns 30A to 30G may be formed of an insulation material. For example, the first to seventh insulation patterns 30A to 30G may be formed of oxide or nitride. For example, the first to seventh insulation patterns 30A to 30G may be formed of a material selected from the group consisting of $SiO_2$, $Si_xO_y$, $Si_3N_4$, $Si_xN_y$, $SiO_xN_y$, $Al_2O_3$, $TiO_2$, and AlN. Although the first to seventh insulation patterns 30A to 30G may include light transmitting materials through which light beams may pass, the present disclosure is not limited thereto.

The first to sixth insulation patterns 30A to 30F may extend to the lateral walls of the plurality of recesses 2 and an upper surface of the first conductive semiconductor layer 11. Although top views of the first to sixth insulation patterns 30A to 30F may have circular shapes, the present disclosure is not limited thereto. For example, the first to sixth insulation patterns 30A to 30G may have an elliptical shape or a polygonal shape corresponding at least a triangle or more.

The first to sixth insulation patterns 30A to 30F may be arranged inside the plurality of recesses 2. The first to sixth insulation patterns 30A to 30F may be arranged on the lateral walls of the plurality of recesses 2. The first to sixth insulation patterns 30A to 30F may cover the light emitting structure 10 exposed to the lateral walls of the plurality of recesses 2, and may extend toward a lower surface of the light emitting structure 10. Although top views of the first to sixth insulation patterns 30A to 30F may have circular shapes, the present disclosure is not limited thereto. For example, the first to sixth insulation patterns 30A to 30F may have an elliptical shape or a polygonal shape corresponding to at least a triangle or more.

The first to sixth insulation patterns 30A to 30F may have different widths in a transverse direction. The widths of the first to sixth insulation patterns 30A to 30F may decrease as they become farther from the pad 92. Although top views of the first to sixth insulation patterns 30A to 30F may have circular shapes, the present disclosure is not limited thereto.

When the first to sixth insulation patterns 30A to 30F have the circular shapes, the widths of the first to sixth insulation patterns 30A to 30F may be diameters. Alternatively, when the first to sixth insulation patterns 30A to 30F may not have the circular shapes, the widths thereof may be distances between the centers of the recesses and distal ends of the corresponding insulation patterns.

The widths of the first to sixth insulation patterns 30A to 30 F may be reduced as they go from the first edge 101 where the pad 92 is located to the second edge 103. Here, the first and second edges 101 and 103 may be arranged to face each other in the first diagonal direction X-X'. For example, the first to sixth insulation patterns 30A to 30F may have first to sixth widths W-1 to W-6, respectively. The first width W-1 of the first insulation pattern 30A may be larger than the second width W-2 of the second insulation pattern 30B. The second width W-2 of the second insulation pattern 30A may be larger than the third width W-3 of the third insulation pattern 30C. The third width W-3 of the third insulation pattern 30C may be larger than the fourth width W-4 of the fourth insulation pattern 30D. The fourth width W-4 of the fourth insulation pattern 30D may be larger than the fifth width W-5 of the fifth insulation pattern 30E. The fifth width W-5 of the fifth insulation pattern 30E may be larger than the sixth width W-6 of the sixth insulation pattern 30F. In the embodiment, the first to sixth insulation patterns have larger widths as they become closer to the pad 92, so that a current crowding phenomenon may be improved in which a current is focused on the first conductive semiconductor layer 11 and the second electrodes 33 adjacent to the pad 92. That is, in the embodiment, a contact area between the second electrodes 33 and the first electrodes 81 adjacent to the pad 92 is reduced to induce current spreading, so that a problem may be solved in which a current is focused on an area adjacent to the pad 92.

For example, when the first width W-1 of the first insulation pattern 30A is 100%, the second width W-2 of the second insulation pattern 30B may be 93% to 95%, the third width W-3 of the third insulation pattern 30C may be 86% to 90%, the fourth width W-4 of the fourth insulation pattern 30D may be 79% to 85%, the fifth width W-5 of the fifth insulation pattern 30E may be 72% to 80%, and the sixth width W-6 of the sixth insulation pattern 30F may be 65% to 75%. Here, although the second to sixth widths W-2 to W-6 of the second to sixth insulation patterns 30B to 30F have been described with reference to the first width W-1 of the first insulation pattern 30A, the present disclosure is not limited thereto. Each of the second to sixth widths W-2 to W-6 of the second to sixth insulation patterns 30B to 30F may be 93% to 95% of the width of the previous insulation pattern. A difference between the first width W-1 of the first insulation pattern 30A and the sixth width W-6 of the sixth insulation pattern 30F may be 35% or less. When the differences between the widths of the first to sixth insulation patterns 30A to 30F are lower than a predetermined range, the current spreading effect may be reduced, and when the differences between the widths thereof exceed the range, since the entire areas of the first to sixth insulation patterns 30A to 30F through which light may not pass increase, light extraction efficiency may deteriorate.

Since the plurality of recesses 2 are arranged at regular intervals, and the widths of the first to sixth insulation patterns 30A to 30F are reduced as they become farther from the pad 92, the intervals between the first to sixth insulation patterns 30A to 30F may gradually increase. A first interval I-1 between the first and second insulation patterns 30A and 30B may be smaller than a second interval I-2 between the second and third insulation patterns 30B and 30C. The second interval I-2 between the second and third insulation patterns 30B and 30C may be smaller than a third interval I-3 between the third and fourth insulation patterns 30C and 30D. The third interval I-3 between the third and fourth insulation patterns 30C and 30D may be smaller than a fourth interval I-4 between the fourth and fifth insulation patterns 30D and 30E. The fourth interval I-4 between the fourth and fifth insulation patterns 30D and 30E may be smaller than a fifth interval I-5 between the fifth and sixth insulation patterns 30E and 30F. Since the second electrodes 33 are arranged at regular intervals, and the widths of the first to sixth insulation patterns 30A to 30F increase as they become closer to the pad 92, the intervals between the first to sixth insulation patterns 30A to 30F may be reduced as they become closer to the pad 92. Here, intervals between the insulation patterns arranged in parallel to each other in a second direction Y-Y' may be the same.

When the fifth interval I-5 between the fifth and sixth insulation patterns 30E and 30F is 100%, the fourth interval I-4 between the fourth and fifth insulation patterns 30D and 30E may be 94% to 97%, the third interval I-3 between the third and fourth insulation patterns 30C and 30D may be 91% to 94%, the second interval I-2 between the second and third insulation patterns 30B and 30C may be 88% to 91%, and the first interval I-1 between the first and second insulation patterns 30A and 30B may be 85% to 88%. Here, although the embodiment has been described with reference to the fifth interval I-5 between the fifth and sixth insulation patterns 30E and 30F, the present disclosure is not limited thereto. Each of the intervals between the first to sixth insulation patterns 30A to 30F may be 94% to 97% of the previous interval.

The seventh insulation pattern 30G may extend outwardly from a lower surface of the light emitting structure 10. That is, edges of the seventh insulation pattern 30G may be arranged on a lower surface of an edge of the light emitting structure 10 and on an upper surface of an edge of the first electrode 81. The seventh insulation pattern 30G may extend outwardly from a side surface of the light emitting structure 10. The seventh insulation pattern 30G may prevent penetration of external moisture, and may reduce an impact transferred to the light emitting structure 10, and the first and second electrodes 33 during an etching process.

The second electrodes 33 may be arranged inside the plurality of recesses 2. The second electrodes 33 may be electrically connected to the first conductive semiconductor layer 11 exposed from the bottom surfaces of the recesses 2. The second electrodes 33 may be directly in contact with the first conductive semiconductor layer 11 exposed from the recesses 2. Side surfaces of the second electrodes 33 may be in contact with the first to sixth insulation patterns 30A to 30F formed on the lateral walls of the plurality of recesses 2. The second electrodes 33 may include at least one of Cr, V, W, Ti, Zn, Ni, Cu, Al, Au, and Mo, and may be formed to have a single layer structure or a multi-layer structure.

Figure 7:
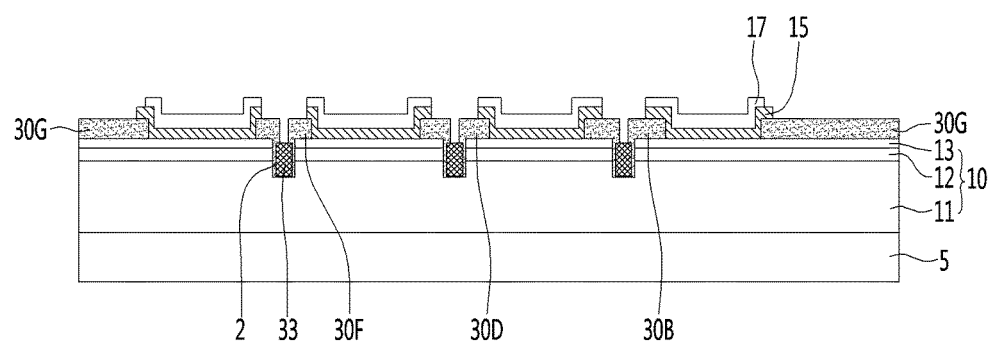

Referring to FIG. 7, the contact layer 15 and the reflective layer 17 may be formed on the light emitting structure 10 exposed from the first to sixth insulation patterns 30A and 30G. Although the contact layer 15 and the reflective layer 17 may be formed through an etching process, the present disclosure is not limited thereto.

The contact layer 15 may be formed on the upper surface of the first conductive semiconductor layer 11. The contact layer 15 may be directly in contact with the first conductive semiconductor layer 11. The contact layer 15 may be arranged between the first conductive semiconductor layer 11 and the reflective layer 17. The contact layer 15 may be electrically connected to the first conductive semiconductor layer 11. The contact layer 15 may be formed of conductive oxide, conductive nitride, or metal. For example, the contact layer 15 may include at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, In, Au, W, Al, Pt, Ag, and Ti.

The reflective layer 17 may be formed on the contact layer 15. The reflective layer 17 may function to reflect a light beam input from the light emitting structure 10. The reflective layer 17 may reflect the light beam from the light emitting structure 10 to the outside, thereby improving light extraction efficiency. The reflective layer 17 may be formed of metal. For example, the reflective layer 17 may be formed of metal including at least one of Ag, Ni, Al, Rh, Pd, Ir, Ru, Mg, Zn, Pt, Cu, Au, and Hf, or an alloy thereof. The reflective layer 17 may have a single layer structure or a multi-layer structure formed of the metal or alloy and a transparent conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), and Antimony-Tin-Oxide (ATO).

Figure 8:
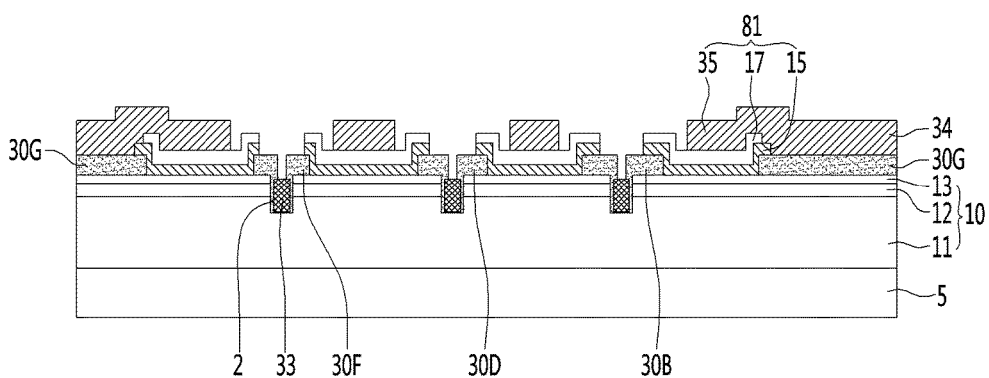

Referring to FIG. 8, the capping layer 35 may be formed on the reflective layer 17 and the seventh insulation pattern 30G. Although the capping layer 35 may be formed through an etching process, the present disclosure is not limited thereto.

The capping layer 35 may be directly in contact with the upper surface of the reflective layer 17 and the upper surface of the seventh insulation patter 30G. The capping layer 35 may be directly in contact with a part of the contact layer 15, which is exposed from the reflective layer 17. The capping layer 35 may be formed of a conductive material. For example, the capping layer 35 may include at least one of Au, Cu, Ni, Ti, Ti—W, Cr, W, Pt, V, Fe, and Mo, and may be formed to have a single layer structure or a multi-layer structure.

Figure 9:
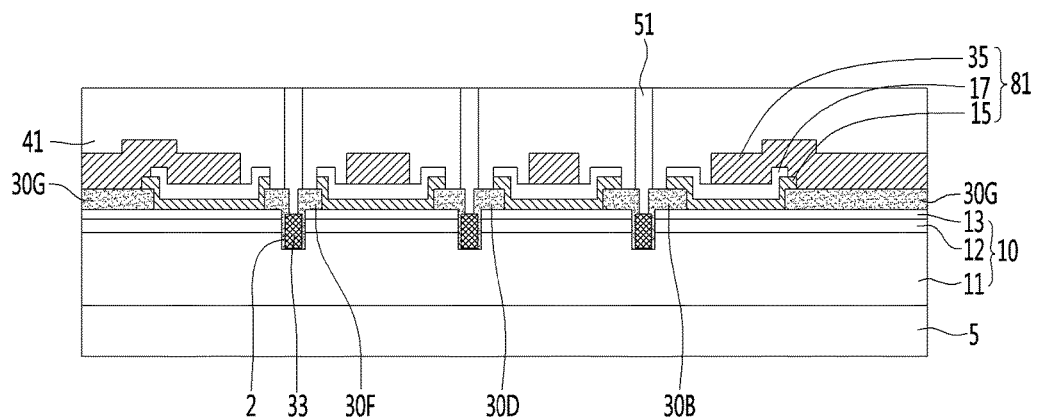

Referring to FIG. 9, the insulation layer 41 may be formed on the capping layer 35, the contact layer 15, the reflective layer 17, and the first to sixth insulation patterns 30A to 30F.

The insulation layer 41 may cover upper portions of the capping layer 35, the contact layer 15, and the reflective layer 17. The insulation layer 41 may be formed of oxide or nitride. For example, the insulation layer 41 may be formed of a material selected from the group consisting of $SiO_2$, $Si_xO_y$, $Si_3N_4$, $Si_xN_y$, $SiO_xN_y$, $Al_2O_3$, $TiO_2$, and AlN.

The plurality of connectors 51 may be formed inside the insulation layer 41 through holes. The plurality of connectors 51 may be directly in contact with the upper surfaces of the second electrodes 33 exposed from the insulation layer 41 through an etching process. The plurality of connectors 51 may be electrically connected to the second electrodes 33. The upper surfaces of the plurality of connectors 51 may be arranged in parallel to the upper surface of the insulation layer 41. The plurality of connectors 51 may include at least one of Ti, Au, Sn, Ni, Cr, Ga, In, Bi, Cu, Ag, Nb, Pd, and Ta.

Figure 10:
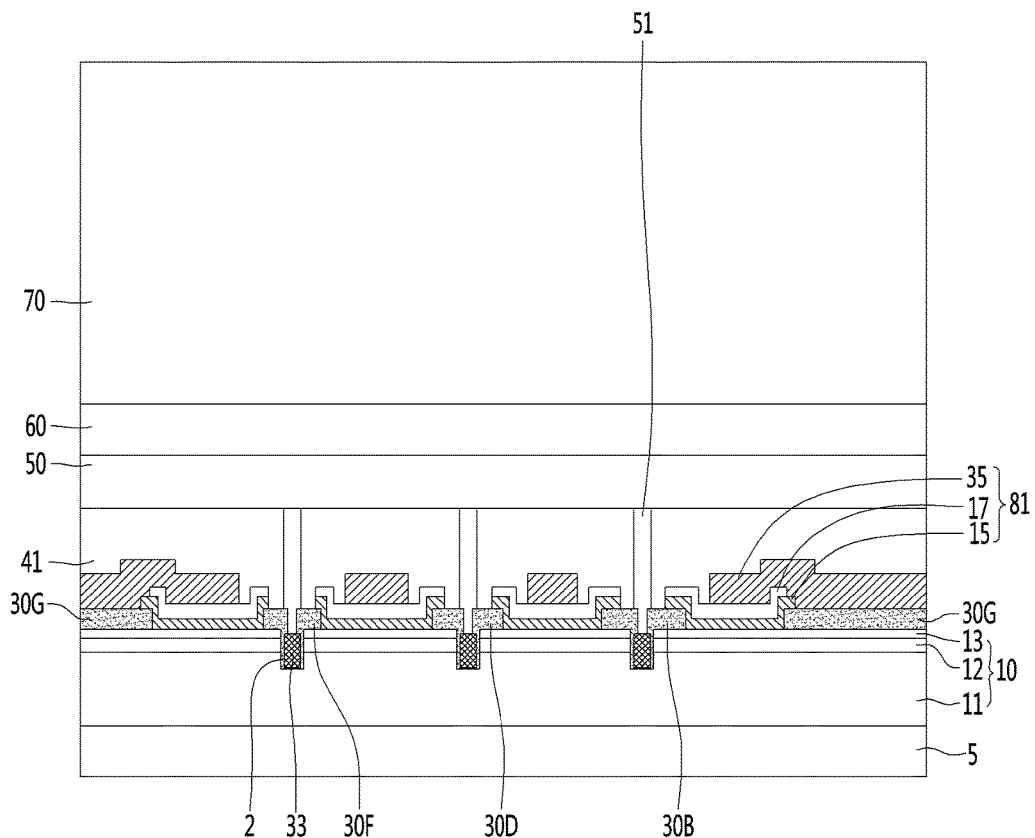

Referring to FIG. 10, the diffusion prevention layer 50 may be formed on the insulation layer 41. The diffusion prevention layer 50 may function to block a material included in the bonding layer 60 from being diffused to the first electrodes 81. The diffusion prevention layer 50 may be electrically connected to the bonding layer 60 and the support member 70. The diffusion prevention layer 50 may include at least one of Cu, Ni, Ti, Ti—W, Cr, W, Pt, V, Fe, and Mo, and may be formed to have a single layer structure or a multi-layer structure.

The bonding layer 60 may be formed on the diffusion prevention layer 50. The bonding layer 60 may be arranged between the diffusion prevention layer 50 and the support member 70. The bonding layer 60 may include barrier metal, bonding metal, or the like. For example, the bonding layer 60 may include at least one of Ti, Au, Sn, Ni, Cr, Ga, In, Bi, Cu, Ag, Nb, Pd, and Ta, and may be formed to have a single layer structure or a multi-layer structure.

The support member 70 may be a metal substrate or a carrier substrate. For example, the support member 70 may be formed of Ti, Cr, Ni, Al, Pt, Au, W, Cu, Mo, Cu—W, and a semiconductor substrate (for example, Si, Ge, GaN, GaAs, ZnO, SiC, SiGe, or the like) into which impurities are injected, and may be formed to have a single layer structure or a multi-layer structure.

Figure 11:
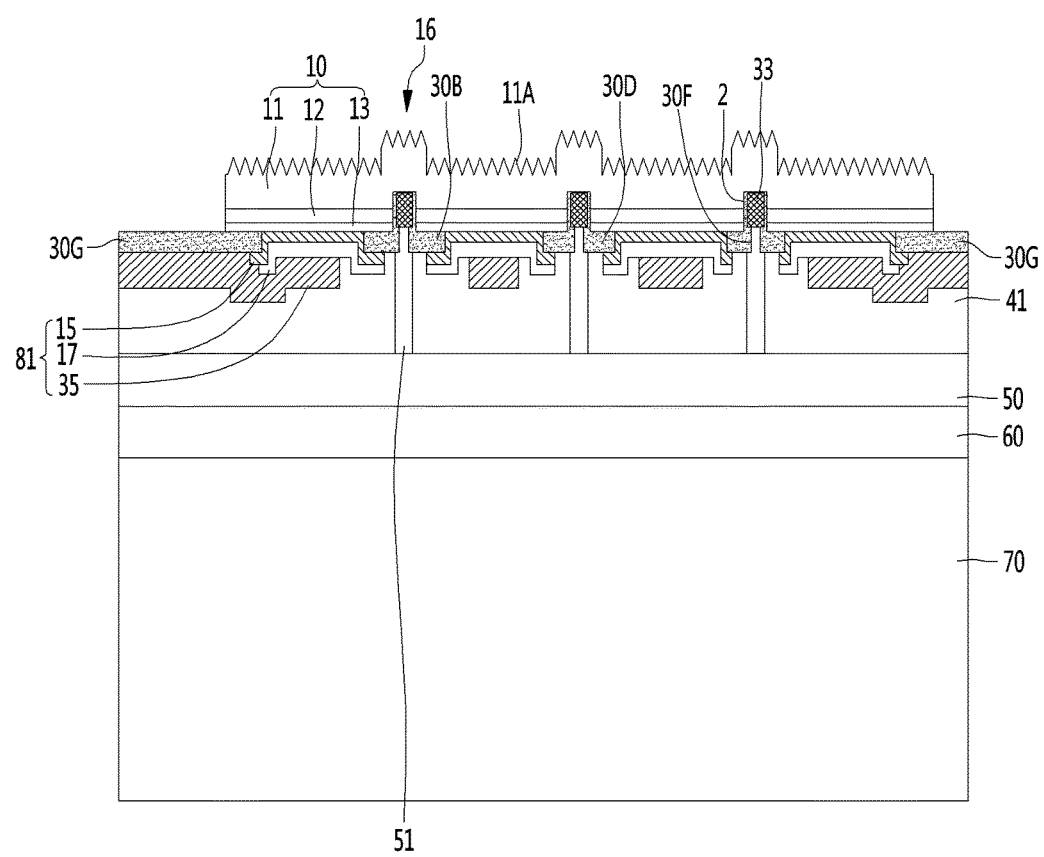

Referring to FIG. 11, the substrate 5 (see FIG. 9) may be removed from the light emitting structure 10. For example, although the substrate 5 (see FIG. 5) may be removed through a laser lift off (LLO) process, the present disclosure is not limited thereto. Here, the LLO process is a process of delaminating the substrate 5 and the light emitting structure 10 from each other by irradiating a lower surface of the substrate 5 with a laser beam.

A structure from which a substrate is removed is rotated such that the light emitting structure 10 is located an upward direction, and an edge of the light emitting structure 10 may be etched through an isolation etching process. At this time, a partial area of the seventh insulation pattern 30G may be exposed from the light emitting structure 10. Although the isolation etching process may be implemented by dry etching, for example, inductively coupled plasma (ICP), the present disclosure is not limited thereto. The first conductive semiconductor layer 11 may have a plurality of protrusions 16 formed therein. The protrusions 16 may be arranged at regular intervals.

The first conductive semiconductor layer 11 may include an uneven structure 11A formed on an upper surface thereof. For example, although the uneven structure 11A may be formed through a photo-electro-chemical (PEC) etching process, the present disclosure is not limited thereto. The uneven structure 11A may function to extract a light beam inside the light emitting structure 10 to the outside, thereby increasing light extraction efficiency.

Figure 12:
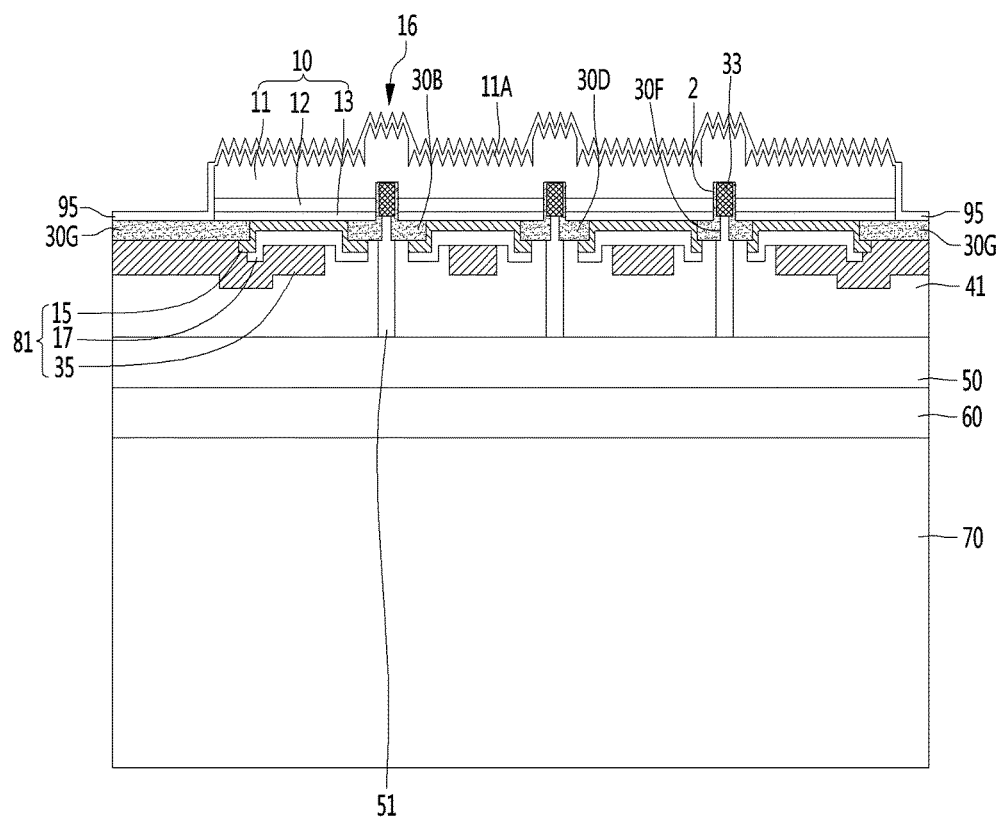

Referring to FIG. 12, the passivation layer 95 may be formed on the light emitting structure 10. The passivation layer 95 may protect a surface of the light emitting structure 10, may have a refractive index that is lower than that of a material of a semiconductor layer constituting the light emitting structure 10, and may improve light extraction efficiency. For example, the passivation layer 95 may be formed of oxide or nitride. For example, the passivation layer 95 may be formed of a material selected from the group consisting of $SiO_2$, $Si_xO_y$, $Si_3N_4$, $Si_xN_y$, $SiO_xN_y$, $Al_2O_3$, $TiO_2$, and AlN.

Figure 13:
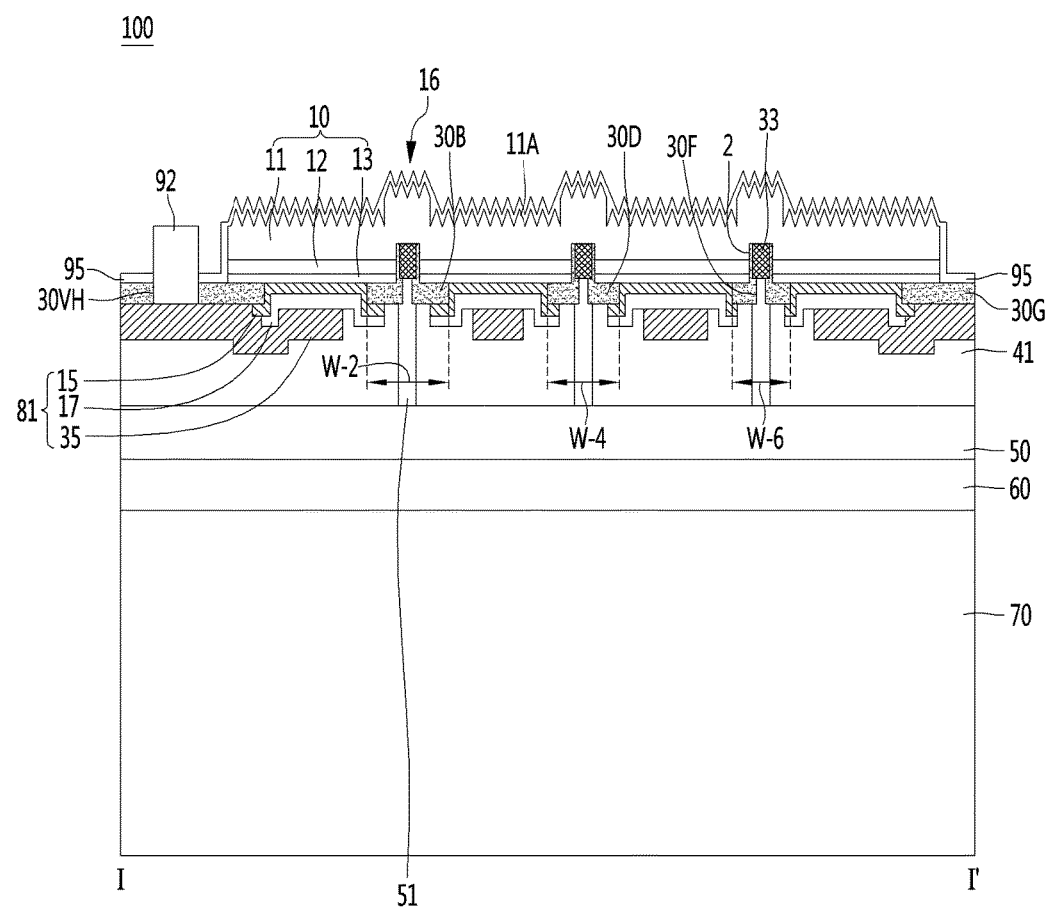

Referring to FIG. 13, the pad 92 may be formed on the first electrode 81 The pad 92 may be electrically connected to the first electrode 81. The pad 92 may be directly in contact with the upper surface of the first electrode 81 exposed from the passivation layer 95 and the seventh insulation pattern 30G through an etching process, and the like. The pad 92 may be directly in contact with the upper surface of the capping layer 35. The pad 92 may be arranged to be outer than the light emitting structure 10. The pad 92 may be arranged on the first electrode 81 located to be outer than the light emitting structure 10. The pad 92 may be arranged to be adjacent to an edge of the semiconductor device 100. The pad 92 may include at least one of Cu, Ni, Ti, Ti—W, Cr, W, Pt, V, Fe, and Mo, and may be formed to have a single layer structure or a multi-layer structure.

The semiconductor device 100 according to the embodiment includes the first to sixth insulation patterns 30A to 30F having the widths which are reduced as they become farther from the pad 92, to induce the current spreading. Accordingly, a current is prevented from being focused around the second electrodes 33 adjacent to the pad 92, so that electrical characteristics may be improved.

Figure 14:
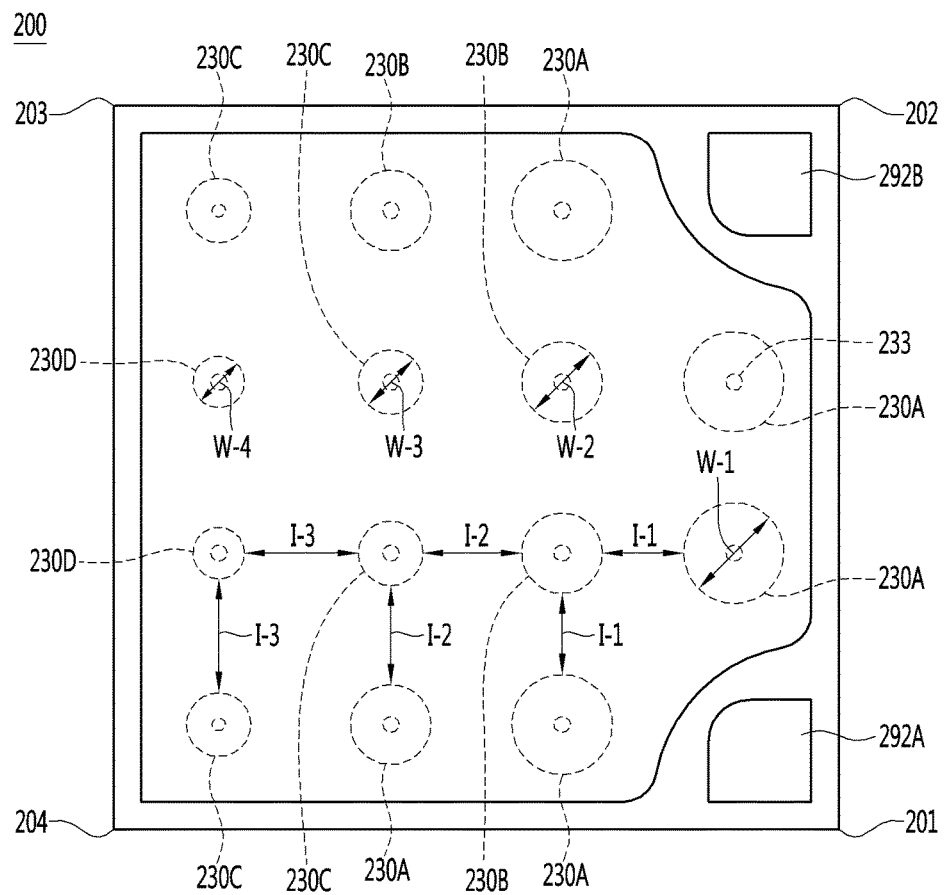
FIG. 14 is a plan view illustrating a semiconductor device according to a second embodiment.

FIG. 14 is a plan view illustrating a semiconductor device according to a second embodiment.

As illustrated in FIG. 14, a semiconductor device 200 according to the second embodiment may include first to fourth insulation patterns 230A to 230D, and first and second pads 292A and 292B. The technical features of the semiconductor device 100 according to the embodiment of FIGS. 1 to 13 may be employed as configurations except for the first to fourth insulation patterns 230A to 230D and the first and second pads 292A and 292B.

The semiconductor device 200 according to the second embodiment may include first and third edges 201 and 203 facing each other and second and fourth edges 202 and 204 facing each other.

The first pad 292A may be arranged to be adjacent to the first edge 201, and the second pad 292B may be arranged to be adjacent to the second edge 202.

The first to fourth insulation patterns 230A to 230D may be spaced apart from each other by a predetermined distance with respect to a virtual line connecting the first pad 292A and the second pad 292B.

The first to fourth insulation patterns 230A to 230D may be formed of an insulation material. For example, the first to fourth insulation patterns 230A to 230D may be formed of oxide or nitride. For example, the first to fourth insulation patterns 230A to 230D may be formed of a material selected from the group consisting of $SiO_2$, $Si_xO_y$, $Si_3N_4$, $Si_xN_y$, $SiO_xN_y$, $Al_2O_3$, $TiO_2$, and AlN. Although the first to fourth insulation patterns 230A to 230D may include light transmitting materials through which light beams may pass, the present disclosure is not limited thereto.

The first to fourth insulation patterns 230A to 230D may surround the second electrodes 233, and may be arranged inside the plurality of recesses. The first to fourth insulation patterns 230A to 230D may be arranged on lateral walls of the plurality of recesses. The first to fourth insulation patterns 230A to 230D may cover the light emitting structure 10 exposed to the lateral walls of the plurality of recesses, and may extend toward a lower surface of the light emitting structure 10. Although top views of the first to fourth insulation patterns 230A to 230D may have circular shapes, the present disclosure is not limited thereto. For example, the first to fourth insulation patterns 230A to 230D may have an elliptical shape or a polygonal shape corresponding to at least a triangle or more.

The first to fourth insulation patterns 230A to 230D may have different widths in a transverse direction. The widths of the first to fourth insulation patterns 230A to 230D may decrease as they become farther from the first and second pads 292A and 292B. The widths of the first to fourth insulation patterns 230A to 230D may be reduced as they go from the first edge 201 where the first pad 292A is located to the third edge 203 in a first diagonal direction X-X'. The widths of the first to fourth insulation patterns 230A to 230D may be reduced as they go from the second edge 202 where the second pad 292B is located to the fourth edge 204 in a second diagonal direction Y-Y'. For example, the first to fourth insulation patterns 230A to 230D may have first to fourth widths W-1 to W-4, respectively. The first width W-1 of the first insulation pattern 230A may be larger than the second width W-2 of the second insulation pattern 230B. The second width W-2 of the second insulation pattern 230B may be larger than the third width W-3 of the third insulation pattern 230C. The third width W-3 of the third insulation pattern 230C may be larger than the fourth width W-4 of the fourth insulation pattern 230D. In another embodiment, the first to fourth insulation patterns 230A to 230B have larger widths as they become closer to the first and second pads 292A and 292B, so that a current crowding phenomenon may be improved in which a current is focused on an area adjacent to the first and second pads 292A and 292B. That is, in another embodiment, a contact area where the second electrodes and first electrodes adjacent to the first and second pads 292A and 292B are directly in contact with each other is reduced to induce current spreading, so that a problem may be solved in which a current is focused on an area closer to the pad 92.

For example, when the first width W-1 of the first insulation pattern 230A is 100%, the second width W-2 of the second insulation pattern 230B may be 93% to 95%, the third width W-3 of the third insulation pattern 230C may be 86% to 90%, and the fourth width W-4 of the fourth insulation pattern 230D may be 79% to 85%. Here, although the second to fourth widths W-2 to W-4 of the second to fourth insulation patterns 230B to 230D have been described with reference to the first width W-1 of the first insulation pattern 230A, the present disclosure is not limited thereto. Each of the second to fourth widths W-2 to W-4 of the second to fourth insulation patterns 230B to 230D may be 93% to 95% of the width of the previous insulation pattern.

The widths of the first to fourth insulation patterns 230A to 230D may differ from each other by 2% to 8% at each predetermined separation distance. A difference between the first width W-1 of the first insulation pattern 230A and the fourth width W-4 of the fourth insulation pattern 230D may be 35% or less. When the differences between the widths of the first to fourth insulation patterns 230A to 230D are lower than a predetermined range, the current spreading effect may be reduced, and when the differences between the widths thereof exceed the range, since the entire areas of the first to fourth insulation patterns 230A to 230D through which light may not pass increase, light extraction efficiency may deteriorate.

Since the widths of the first to fourth insulation patterns 230A to 230D are reduced as they become farther from the first and second pads 292A and 292B, the intervals between the first to fourth insulation patterns 230A to 230D may gradually increase. A first interval I-1 between the first and second insulation patterns 230A and 230B may be smaller than a second interval I-2 between the second and third insulation patterns 230B and 230C. The second interval I-2 between the second and third insulation patterns 230B and 230C may be smaller than a third interval I-3 between the third and fourth insulation patterns 230C and 230D. In another embodiment, since the second electrodes 233 are arranged at regular intervals, and the widths of the first to fourth insulation patterns 230A to 230D increase as they become closer to the first and second pads 292A and 292B, the intervals between the first to fourth insulation patterns 230A to 230D may be reduced as they become closer to the first and second pads 292A and 292B. Here, the intervals between the insulation patterns arranged at the same distance from the first and second pads 292A and 292B may be the same.

For example, when the third interval I-3 between the third and fourth insulation patterns 230C and 230D is 100%, the second interval I-2 between the second and third insulation patterns 230B and 230C may be 94% to 97%, and the first interval I-1 between the first and second insulation patterns 230A and 230B may be 91% to 94%. Here, although the another embodiment has been described with reference to the third interval I-3 between the third and fourth insulation patterns 230C and 230D, the present disclosure is not limited thereto. Each of the intervals between the first to fourth insulation patterns 30A to 230D may be 94% to 97% of the previous interval.

The semiconductor device 200 according to the second embodiment includes the first to fourth insulation patterns 230A to 230D having the widths which are reduced as they become farther from the first and second pads 292A and 292B, to induce the current spreading. Accordingly, a current is prevented from being focused around the second electrodes 233 adjacent to the first and second pads 292A and 292B, so that electrical characteristics may be improved.

Figure 15:
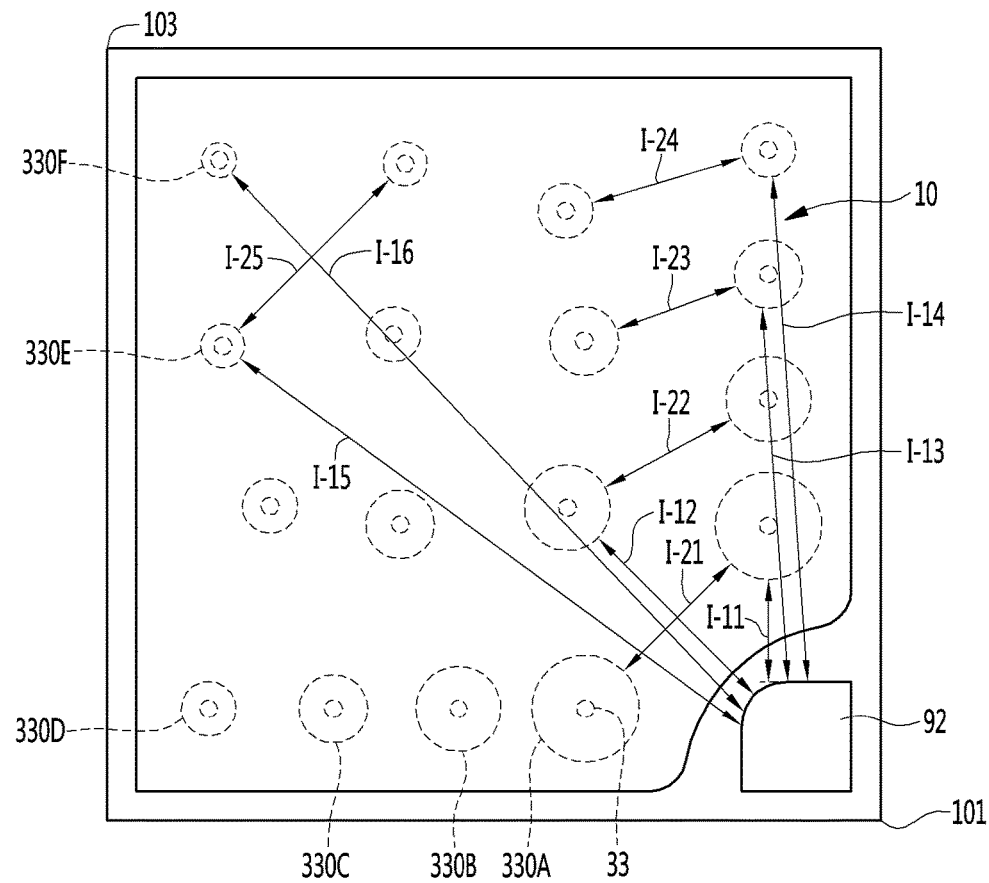
FIG. 15 is a plan view illustrating a semiconductor device according to a third embodiment.

FIG. 15 is a plan view illustrating a semiconductor device according to a third embodiment.

As illustrated in FIG. 15, a semiconductor device 300 according to the third embodiment may include first to sixth insulation patterns 330A to 330F. The technical features of the semiconductor device 100 according to the embodiment of FIGS. 1 to 13 may be employed as configurations except for the first to sixth insulation patterns 330A to 330F.

The widths of the first to sixth insulation patterns 330A to 330F may decrease as they become farther from the pad 92. The technical features of the semiconductor device 100 according to the embodiment of FIGS. 1 to 13 may be employed as the widths of the first to sixth insulation patterns 330A to 330F.

The first to sixth insulation patterns 330A to 330F may be arranged at different intervals from the pad 92. Each of the first to sixth insulation patterns 330A to 330F may be provided in at least one. For example, two first insulation patterns 330A may be arranged at the same interval from the pad 92, and three second insulation patterns 330B may be arranged at the same interval from the pad 92. That is, the first to sixth insulation patterns 330A to 330F may be arranged in an arc shape with respect to the pad 92. First intervals I-11 between the first insulation patterns 330A and the pad 92 may be the same, second intervals I-12 between the second insulation patterns 330B and the pad 92 may be the same, third intervals I-13 between the third insulation patterns 330C and the pad 92 may be the same, fourth intervals I-14 between the fourth insulation patterns 330D and the pad 92 may be the same, and fifth intervals between the fifth insulation patterns 330E and the pad 92 may be the same. Here, a sixth interval I-16 may be provided between the sixth insulation pattern 330F and the pad 92, and the sixth insulation pattern 330F may be arranged to be farthest from the pad 92. Also, although one sixth insulation pattern 330F is configured in another embodiment, the present disclosure is not limited thereto. Further, the sixth insulation pattern 330F may be provided in plurality.

In the third embodiment, separation intervals between the first to sixth insulation patterns 330A to 330F may be the same. For example, the first insulation patterns 330A may be arranged at the same seventh interval I-21, the second insulation patterns 330B may be arranged at the same eighth interval I-22, the third insulation patterns 330C may be arranged at the same ninth interval I-23, the fourth insulation patterns 330D may be arranged at the same tenth interval I-24, and the fifth insulation patterns 330E may be arranged at the same eleventh interval I-25.

In the semiconductor device 300 according to the third embodiment, since the widths of the first to sixth insulation patterns 330A to 330F arranged in an arch shape at regular intervals from the pad 92 decrease as they become farther away from the pad 92, a current crowding phenomenon may be improved in which a current is focused around the pad 92. That is, in yet another embodiment, since the current spreading is induced, the current crowding phenomenon is prevented in which the current is focused around the second electrodes 33 adjacent to the pad 92, so that electrical characteristics may be improved.

Figure 16:
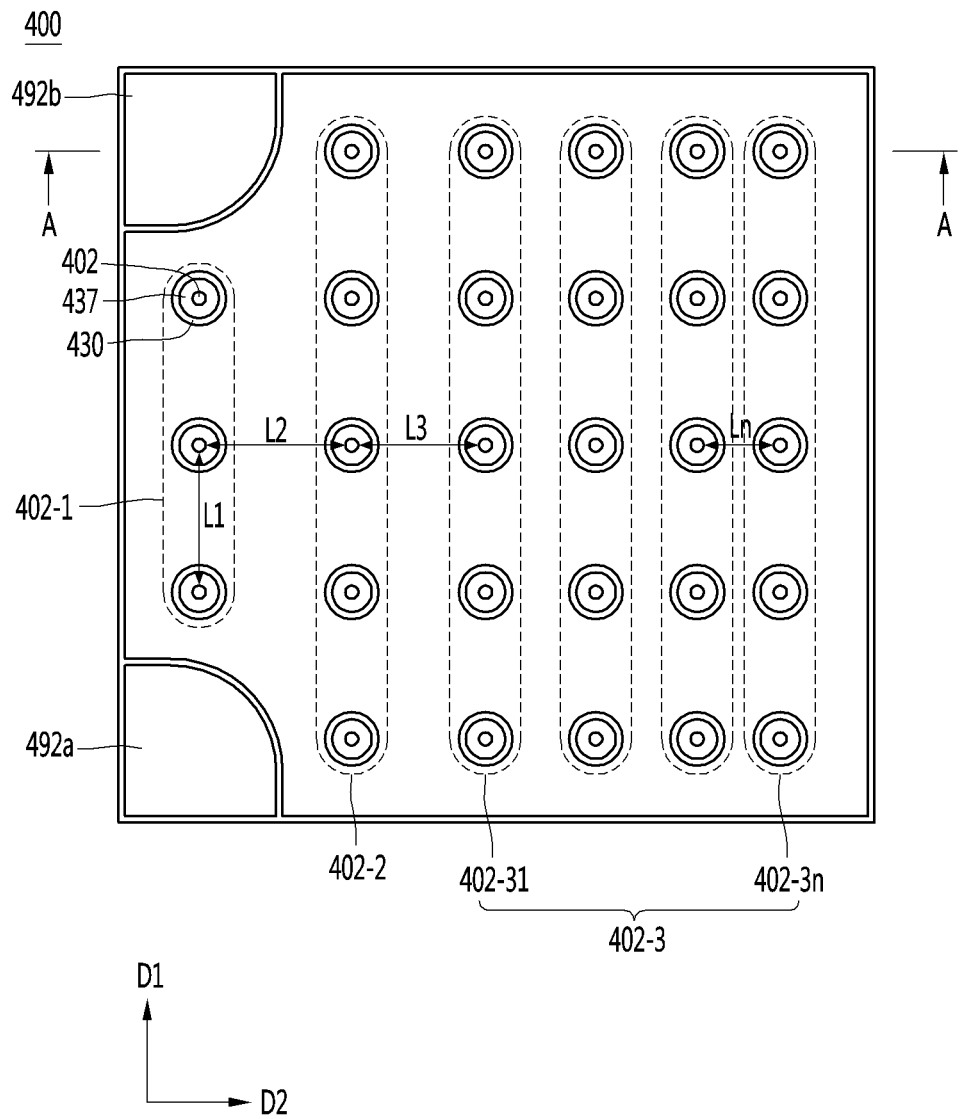
FIG. 16 is a plan view illustrating a semiconductor device according to a fourth embodiment.
Figure 17:
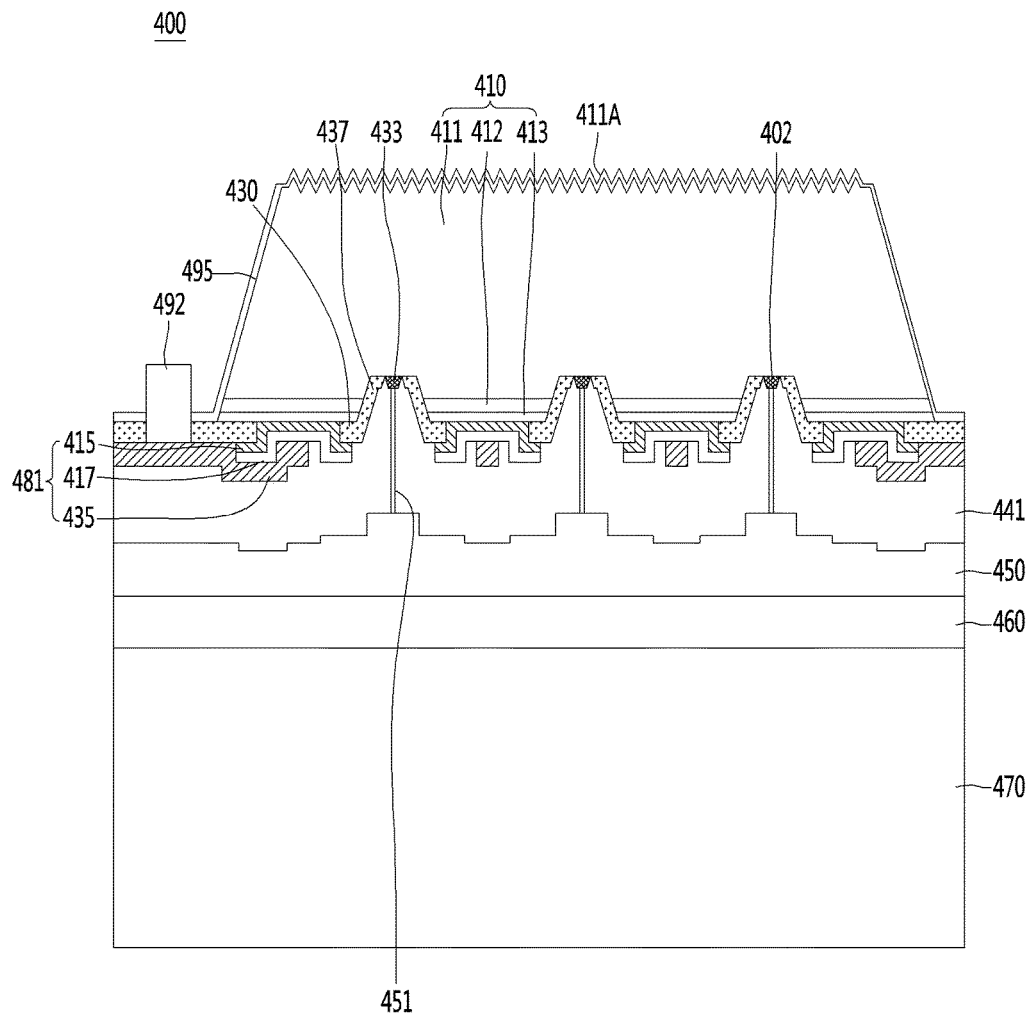
FIG. 17 is a sectional view illustrating the semiconductor device taken along line A-A' of FIG. 16.

FIG. 16 is a plan view illustrating a semiconductor device according to a fourth embodiment, FIG. 17 is a sectional view illustrating the semiconductor device taken along line A-A' of FIG. 16, FIG. 18 is a view illustrating a comparison between a current spreading phenomenon of the semiconductor device according to the fourth embodiment and a current spreading phenomenon of a semiconductor device according to the related art, and FIG. 19 is a view illustrating an output of the semiconductor device according to the fourth embodiment and an output of the semiconductor device according to the related art. Here, for convenience of description, only three recesses of FIG. 16 will be illustrated in FIG. 17.

Referring to FIGS. 16 and 17, a semiconductor device 400 according to the fourth embodiment may include a light emitting structure 410 including a first conductive semiconductor layer 411, an active layer 412, and a second conductive semiconductor layer 413, second electrodes 481 electrically connected to the second conductive semiconductor layer 413, first electrodes 433 electrically connected to the first conductive semiconductor layer 411, and a pad portion 492 including a first pad and a second pad electrically connected to the second electrodes 481.

The light emitting structure 410 may include the first conductive semiconductor layer 411, the active layer 412 located under the first conductive semiconductor layer 411, and the second conductive semiconductor layer 413 located under the active layer 412. The first conductive semiconductor layer 411 may be implemented using a semiconductor compound, for example, a group-group and group-group compound semiconductor. The first conductive semiconductor layer 411 may be formed in a single layer or multiple layers.

The first conductive semiconductor layer 411 may be doped with a first conductive dopant. For example, when the first conductive semiconductor layer 411 is an n-type semiconductor layer, the first conductive semiconductor layer 11 may include an n-type dopant. For example, although the n-type dopant may include Si, Ge, Sn, Se, and Te, the present disclosure is not limited thereto. Although the first conductive semiconductor layer 411 may include a semiconductor material having a composition formula of $In_xAl_yGa_{1-x-y}N$ ($0=x=1$, $0=y=1$, $0=x+y=1$), the present disclosure is not limited thereto. For example, the first conductive semiconductor layer 411 may be selected from GaN, AlN, AlGaN, InGaN, InN, InAlGaN, AlInN, AlGaAs, GaP, GaAs, GaAsP, AlGaInP, and the like. The first conductive semiconductor layer 411 may include an uneven structure 411A formed on an upper surface thereof. Although the uneven structure 411A may have a cross section having peaks and valleys, the present disclosure is not limited thereto. Further, the uneven structure 11A may be formed to have a polygonal shape or a shape having a curvature. The uneven structure 411A may improve light extraction efficiency.

The active layer 412 may be arranged under the first conductive semiconductor layer 411.

The active layer 412 may selectively include a single quantum well, a multiple quantum well (MQW), a quantum wire structure, or a quantum dot structure. The active layer 12 may be formed of a compound semiconductor. The active layer 12 may be implemented in at least one of, for example, a group-group and group-group compound semiconductor.

When the active layer 412 is implemented in a MQW structure, quantum wells and quantum walls may be arranged alternately. The quantum wells and the quantum walls may be a semiconductor material having a composition formula of $In_xAl_yGa_{1-x-y}N$ ($0 \leq x \leq 1$, $0 \leq y \leq 1$, $0 \leq x+y \leq 1$). For, although the active layer 12 may be formed in one or more pair structures of InGaN/GaN, InGaN/AlGaN, InGaN/InGaN, InAlGaN/InAlGaN, GaN/AlGaN, InAlGaN/GaN, GaInP/AlGaInP, GaP/AlGaP, InGaP/AlGaP, GaAs/AlGaAs, and InGaAs/AlGaAs, the present disclosure is not limited thereto.

The second conductive semiconductor layer 413 may be arranged under the active layer 412.

The second conductive semiconductor layer 413 may be implemented using a semiconductor compound, for example, a group-group and group-group compound semiconductor. The second conductive semiconductor layer 413 may be formed in a single layer or multiple layers. The second conductive semiconductor layer 413 may be doped with a second conductive dopant. For example, when the second conductive semiconductor layer 413 is a p-type semiconductor layer, the second conductive semiconductor layer 13 may include a p-type dopant. For example, although the p-type dopant may include Mg, Zn, Ca, Sr, Ba, and the like, the present disclosure is not limited thereto. Although the second conductive semiconductor layer 413 may include a semiconductor material having a composition formula of $In_xAl_yGa_{1-x-y}N$ ($0=x=1$, $0=y=1$, $0=x+y=1$), the present disclosure is not limited thereto. For example, the second conductive semiconductor layer 413 may be selected from GaN, AlN, AlGaN, InGaN, InN, InAlGaN, AlInN, AlGaAs, GaP, GaAs, GaAsP, AlGaInP, and the like.

Although the light emitting structure 410 has been described such that the first conductive semiconductor layer 411 corresponds to an n-type semiconductor layer and the second conductive semiconductor layer 413 corresponds to a p-type semiconductor layer, the first conductive semiconductor layer 411 may be formed in the p-type semiconductor layer and the second conductive semiconductor layer 413 may be formed in an n-type semiconductor layer. The present disclosure is not limited thereto. A semiconductor having a polarity that is opposite to that of the second conductive semiconductor layer 413, for example, an n-type semiconductor layer (not illustrated) may be formed on the second conductive semiconductor layer 13. Accordingly, the light emitting structure 410 may be implemented in one of an n-p junction structure, a p-n junction structure, an n-p-n junction structure, and a p-n-p junction structure.

The second electrodes 481 may be arranged under the light emitting structure 10. The second electrodes 481 may be arranged between the light emitting structure 410 and a support member 470. The second electrodes 481 may be electrically connected to the second conductive semiconductor layer 413.

The second electrodes 481 may be electrically isolated from the first electrodes 433. Each of the second electrodes 481 may include a contact layer 415, a reflective layer 417, and a capping layer 435.

The contact layer 415 may be arranged under the second conductive semiconductor layer 413. The contact layer 415 may be directly in contact with the second conductive semiconductor layer 413. The contact layer 415 may be arranged between the second conductive semiconductor layer 413 and the reflective layer 417 to serve to allow the contact layer 415 and the reflective layer 417 to be effectively in contact with each other, and to smoothly inject a current into the second conductive semiconductor layer 413. Also, the contact layer 415 may extend from the bottom surface of the second conductive semiconductor layer 413 to the bottom surface of a current blocking layer 430. When the contact layer 415 is arranged at a part of the bottom surface of the current blocking layer 430, the reflective layer 417 may be also arranged to vertically overlap with a partial area of the current blocking layer 430.

The thickness of the contact layer 415 may be 1 nm to 10 nm. When the thickness of the contact layer 415 is lower than 1 nm, electrical characteristics of the semiconductor device are degraded, and when the thickness of the contact layer 415 exceeds 10 nm, light extraction efficiency is degraded due to an increase in a light absorption rate.

When the reflective layer 417 vertically overlaps with the partial area of the current blocking layer 430, an area of the reflective layer 417, which may reflect a light beam emitted from the active layer 412 to a lower side of the light emitting structure 410, may increase.

The contact layer 415 may be electrically connected to the second conductive semiconductor layer 413. The contact layer 415 may be formed of conductive oxide, conductive nitride, or metal. For example, the contact layer 415 may include at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, In, Au, W, Al, Pt, Ag, and Ti.

The reflective layer 417 may be arranged between the contact layer 415 and the capping layer 435. The reflective layer 417 may be electrically connected to the contact layer 415 and the capping layer 435. The reflective layer 417 may function to reflect, to an upper side of the light emitting structure 410, a light beam emitted from the active layer 412 to the lower side of the light emitting structure 410. An area where the reflective layer 417 is arranged may be equal to or smaller than an area where the contact layer 415 is arranged. When the area where the reflective layer 417 is arranged is smaller than or equal to the area where the contact layer 415 is arranged, electrical reliability of the semiconductor device may be improved, and when the area where the reflective layer 417 is arranged is larger than the area where the contact layer 415 is arranged, optical characteristics of the semiconductor layer may be improved, but the electrical characteristics of the semiconductor layer may be degraded.

The reflective layer 417 may be formed of metal. The reflective layer 417 may be formed of metal including at least one of Ag, Ni, Al, Rh, Pd, Ir, Ru, Mg, Zn, Pt, Cu, Au, and Hf, or an alloy thereof. The reflective layer 417 may have a single layer structure or a multi-layer structure formed of the metal or alloy and a transparent conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), and Antimony-Tin-Oxide (ATO).

When the reflective layer 417 is formed of an Ag/Ni layer, the thickness of the Ag layer may be 100 nm to 300 nm. When the Ag layer is lower than 100 nm, since the density of the reflective layer 417 is not high, reflectivity may be greatly reduced. When the thickness of the Ag layer exceeds 300 nm, delamination occurs due to a stress.

The thickness of the Ni layer may be 10 nm to 100 nm. When the thickness of the Ni layer is lower than 10 nm, it is insufficient to fix Ag atoms having high migration characteristics and high agglomeration characteristics. When the thickness of the Ni layer exceeds 100 nm, a possibility that the Ag layer is delaminated increases due to a high stress.

The capping layer 435 may be arranged under the reflective layer 417. When the area where the contact layer 415 is arranged is larger than the area where the reflective layer 417 is arranged, the capping layer 435 may be directly in contact with a part of the contact layer 415, which is exposed from the reflective layer 417. The capping layer 435 may be arranged under the pad portion 492. The capping layer 435 may be electrically connected to the pad portion 492. The capping layer 435 may be directly in contact with a lower surface of the pad portion 492.

The capping layer 435 may serve to evenly spread a current injected from the pad portion 492 to the second conductive semiconductor layer 413 to the light emitting structure 410.

The capping layer 435 may provide driving electric power supplied from the pad portion 492 to the light emitting structure 410. The capping layer 435 may be formed of a conductive material. For example, the capping layer 435 may include at least one of Au, Cu, Ni, Ti, Ti—W, Cr, W, Pt, V, Fe, and Mo, and may be formed to have a single layer structure or a multi-layer structure. An edge of the capping layer 435 may be arranged to be outer than an edge of the light emitting structure 410.

When the capping layer 435 is formed of a Ti/Ni/Ti layer, the thickness of the Ti layer on one side of the Ni layer may be 1 nm to 3 nm. When the thickness of the Ti layer is lower than 1 nm, adhesive characteristics between the Ti layer under the Ni layer and the Ti layer on the Ni layer may be weakened. When the thickness of the Ti layer exceeds 3 nm, a possibility that the adhesive layer itself is delaminated increases.

The thickness of the Ni layer may be 300 nm to 400 nm. When the thickness of the Ni layer is lower than 300 nm, diffusion of the current becomes difficult. When the thickness of the Ni layer exceeds 400 nm, a possibility that delamination occurs due to a stress increases.

The thickness of the Ti layer on the other side of the Ni layer may be 10 nm to 100 nm. When the thickness of the Ti layer is lower than 10 nm, an adhesive force between the Ti layer and a lower insulation layer deteriorates. When the thickness of the Ti layer exceeds 100 nm, a possibility that delamination occurs due to a stress between the Ti layer and the lower insulation layer increases.

The support member 470 may be arranged under the second electrodes 481. The support member 470 may be electrically connected to the first conductive semiconductor layer 411. The support member 470 may be electrically connected to the first electrodes 433.

To this end, the support member 470 may include a conductive material. The support member 470 may be a metal substrate or a carrier substrate. For example, the support member 470 may be formed of Ti, Cr, Ni, Al, Pt, Au, W, Cu, Mo, Cu—W, and a semiconductor substrate (for example, Si, Ge, GaN, GaAs, ZnO, SiC, SiGe, or the like) into which impurities are injected, and may be formed to have a single layer structure or a multi-layer structure.

The support member 470 may include a bonding layer 460 and a diffusion prevention layer 450 on an upper side thereof.

The diffusion prevention layer 450 may function to prevent a material included in the bonding layer 460 from being diffused. The diffusion prevention layer 450 may be electrically connected to the bonding layer 460 and the support member 470. The diffusion prevention layer 450 may include at least one of Cu, Ni, Ti, Ti—W, Cr, W, Pt, V, Fe, and Mo, and may be formed to have a single layer structure or a multi-layer structure.

The bonding layer 460 may be arranged under the diffusion prevention layer 450. The bonding layer 460 may be arranged between the diffusion prevention layer 450 and the support member 470. The bonding layer 460 may serve to stably bond a gap between the diffusion prevention layer 450 and the support member 470. The bonding layer 460 may include barrier metal, bonding metal, or the like. For example, the bonding layer 460 may include at least one of Ti, Au, Sn, Ni, Cr, Ga, In, Bi, Cu, Ag, Nb, Pd, and Ta, and may be formed to have a single layer structure or a multi-layer structure.

The pad portion 492 may be arranged on the second electrodes 481. The pad portion 492 may be electrically connected to the second electrodes 481. The pad portion 492 may be spaced apart from the light emitting structure 410. The pad portion 492 may be arranged to be outer than the light emitting structure 410. The pad portion 492 may be arranged on the second electrodes 481 located to be outer than the light emitting structure 410.

The pad portion 492 may include a first pad 492a and a second pad 492b. The first pad 492a may be arranged to be adjacent to one edge of the semiconductor device 400. The second pad 492b may be arranged to be adjacent to the other edge of the semiconductor device 400.

The pad portion 492 may include at least one of Cu, Ni, Ti, Ti—W, Cr, W, Pt, V, Fe, and Mo, and may be formed to have a single layer structure or a multi-layer structure.

The semiconductor device 400 according to the embodiment may include a passivation layer 495 arranged on the light emitting structure 410. The passivation layer 495 may protect a surface of the light emitting structure 410, and may insulate the pad portion 492 and the light emitting structure 410 from each other. The passivation layer 495 has a refractive index that is lower than those of the materials of the semiconductor layers constituting the light emitting structure 410. Since a light beam inside the light emitting structure 410 is refracted to the passivation layer 495 having a low refractive index, total reflection occurring on an interface between the light emitting structure 410 and the passivation layer 495 is reduced, so that light extraction efficiency may be improved. For example, the passivation layer 495 may be formed of oxide or nitride. For example, the passivation layer 495 may be formed of a material selected from the group consisting of SiO2, SixOy, Si3N4, SixNy, SiOxNy, Al2O3, TiO2, AlN, and the like.

The semiconductor device 400 according to the embodiment may further include an insulation layer 441 configured to insulate the first electrodes 481 and the second electrodes 433 from each other. The insulation layer 441 may be arranged between the first electrodes 481 and the second electrodes 470. The insulation layer 441 may be formed of oxide or nitride. For example, the insulation layer 441 may be of a material selected from the group consisting of SiO2, SixOy, Si3N4, SixNy, SiOxNy, Al2O3, TiO2, AlN, and the like.

The semiconductor device 400 according to the embodiment may include a plurality of recesses 402, the second electrodes 433, and a plurality of connectors 451 electrically connecting the support member 470 and the first conductive semiconductor layer 411.

The plurality of recesses 402 may be arranged inside the light emitting structure 410. The recesses 402 may extend from the second conductive semiconductor layer 413 via the active layer 412 to a part of the first conductive semiconductor layer 411. The recesses 402 may expose a part of the first conductive semiconductor layer 411 to electrically connect the support member 470 and the first conductive semiconductor layer 411. The plurality of recesses 402 may be arranged at regular intervals. Although the widths of the recesses 402 may be the same, the present disclosure is not limited thereto. Intervals between the plurality of recesses 402 may become smaller as the recesses 402 become farther away from the pad portion 492. A structure of the recesses 402 of the semiconductor device according to the embodiment will be described below in more detail.

The first electrodes 433 may be arranged inside the plurality of recesses 2. The first electrodes 433 may be electrically connected to the first conductive semiconductor layer 411 exposed from the recesses 402. The first electrodes 433 may be directly in contact with the first conductive semiconductor layer 411 exposed from the recesses 402. The first electrodes 433 may include at least one of Cr, V, W, Ti, Zn, Ni, Cu, Al, Au, and Mo, and may be formed to have a single layer structure or a multi-layer structure. The diameter of the first electrodes 433 may be 30 μm to 40 μm.

The plurality of connectors 451 may be arranged under the first electrodes 433. The plurality of connectors 451 may be electrically connected to the first electrodes 433. The plurality of connectors 451 may be connected to a conductive substrate 70 through the insulation layer 441. The plurality of connectors 451 may be directly in contact with the diffusion prevention layer 450. The plurality of connectors 451 may include at least one of Ti, Au, Sn, Ni, Cr, Ga, In, Bi, Cu, Ag, Nb, Pd, and Ta.

The semiconductor device 400 according to the embodiment may further include second insulation layers 437 configured to insulate the diffusion prevention layer 450, the active layer 412, and the first conductive semiconductor layer 413 from each other. The second insulation layers 437 may be arranged to surround the first electrodes 433. The second insulation layers 437 may be arranged along a side wall of the first conductive semiconductor layer 411, a side wall of the active layer 412, and a side wall of the second conductive semiconductor layer 413 exposed by the recesses 402. Here, the diameter of the second insulation layers 437 may be 50 μm to 60 μm.

Current blocking layers (CBLs) 430 which are in contact with a lower portion of the second conductive semiconductor layer 413 may be further formed at lower portions of the second insulation layers 437. The current blocking layers 430 may be arranged to surround the recesses 402. Here, one side of each of the current blocking layers 430 may be defined as an area between one side of a lower portion vertically overlapping with the second conductive semiconductor layer 413 and the other side of the lower portion not overlapping with the second conductive semiconductor layer 413. A side wall of the one side and a part of a lower portion of the current blocking layer 430 may be in contact with the contact layer 415. The part of the lower portion of the current blocking layer 430 may be in contact with the insulation layer 441. The diameter of the current blocking layers 430 may be 90 μm to 95 μm.

The current blocking layers 430 may be an elliptical shape or a polygonal shape corresponding to at least a triangle or more.

The current blocking layers 430 may be formed of oxide or nitride. For example, the current blocking layers 430 may be of a material selected from the group consisting of SiO2, SixOy, Si3N4, SixNy, SiOxNy, Al2O3, TiO2, AlN, and the like. Although the current blocking layers 430 may include light transmitting materials through which light beams may pass, the present disclosure is not limited thereto.

In such a semiconductor device, a current may be focused around the recess 402 adjacent to the pad portion 492. Thus, in the semiconductor device according to the first embodiment, an interval between the recesses 402 is controlled so that the current is prevented from being focused around the pad portion 492. Here, the interval between the recesses 402 may be defined as a distance between the centers of the adjacent first electrodes 433 spaced apart from each other in the recesses 402.

As illustrated in FIG. 16, the plurality of recesses 402 may include multiple groups of recesses. The multiple groups of recesses 402 may be arranged such that intervals between the recesses 402 become smaller as the recesses 402 become farther away from the pad portion 492.

A first group of recesses 402-1 may include a plurality of recesses 402 formed between the first pad 492a and the second pad 492b. The first group of recesses 402-1 may be spaced apart from each other between the first pad 492a and the second pad 492b at a first interval L1 in a first direction D1 connecting the first pad 492a and the second pad 492b.

A second group of recesses 402-2 may be spaced apart from the first group of recesses 402-1 by a second interval L2 in a second direction D2. The second direction D2 may be perpendicular to the second direction D1, and the second direction D2 may be a direction further away from the pad portion 492. The second interval L2 may be larger than the first interval L1. Although the second group of recesses 402-2 may be arranged at the same interval as the first interval L1, the present disclosure is not limited thereto.

The second interval L2 may be 1.25 to 1.35 times of the first interval L1. Unlike this, the second interval L2 may be determined by Equation (1).

$$L2 = \alpha L \times \beta L1 \, (\alpha = 1.4 \sim 1.5, \beta = 1/5 \sim 1/7) \text{ (here, } \alpha \text{ and } \beta \text{ are arbitrary experimental values)} \quad \text{[Equation 1]}$$

A third group of recesses 402-3 may be spaced apart from the second group of recesses 402-2 by a third interval L3 in the second direction D2. The third group of recesses 402-3 are further away from the pad portion 492 than the second group of recesses 402-2. The third interval L3 may be smaller than the first interval L1.

The third group of recesses 402-3 may include multiple groups of recesses. The third group of recesses 402-3 may include a 3-1 group of recesses 402-31 adjacent to the second group of recesses 402-2 to a 3-n group of recesses 402-3n furthest from the second group of recesses 402-2. Intervals between the third group of recesses 402-3 may increase as they become closer to the pad portion 492. For example, the intervals between the third group of recesses 402-3 may increase at regular intervals as they become closer to the pad portion 492.

When the intervals between the third group of recesses 402-3 increase as the third group of recesses 402-3 become closer to the pad portion 492, since the intervals between the third group of recesses 402-3 further away from the pad portion 492 become smaller, the current focused around the recesses 402 adjacent to the pad portion 492 may be diffused.

An interval Ln between the 3-n group of recesses 402-3n arranged to be furthest from the pad portion 492 and a 3-(n−1) group of recesses (not illustrated) adjacent to the 3-n group of recesses 402-3n among the third group of recesses 402-3 may be fixed constantly. For example, the interval Ln between the 3-n group of recesses 402-3n and the 3-(n−1) group of recesses adjacent thereto may be determined by Equation (2).

$$Ln = \beta L1 \text{ (here, } \beta \text{ is an arbitrary experimental value)} \quad [\text{Equation 2}]$$

B may be determined by an experimental value according to the size of the semiconductor device, and may be formed to be 1/5 to 1/7. For example, when it is assumed that L1=1248 μm, Ln may be 208 μm, L(n−1) may be 248 μm, and L(n−2) may be 288 μm. These numerical values are an example of Equations (1) and (2), and the present disclosure is not limited thereto.

In the semiconductor device 400 according to the fourth embodiment, the interval between the third group of recesses 402-3 is determined with respect to the first interval L1, so that the third group of recesses 402-3 may be arranged at proper intervals.

As illustrated in FIG. 18, in a semiconductor device according to the related art in which intervals between groups of recesses are the same, a current is focused on a recess area adjacent to a pad. On the other hand, in the semiconductor device 400 according to the fourth embodiment in which the intervals between the multiple groups of recesses are controlled, it can be identified that a current is distributed over the entire area of the groups of recesses.

As illustrated in FIG. 19, it can be identified that when the conventional current is increased from 350 mA to 1500 mA, in the semiconductor device according to the first embodiment, an output may be reduced by 0.4% as compared with the related art.

The semiconductor device according to the fourth embodiment may prevent a current from being focused, and improve heat generation characteristics, thereby improving a lifespan and reliability. Also, the semiconductor device according to the embodiment may reduce heat dissipation costs due to a reduction in a temperature.

Figure 20:
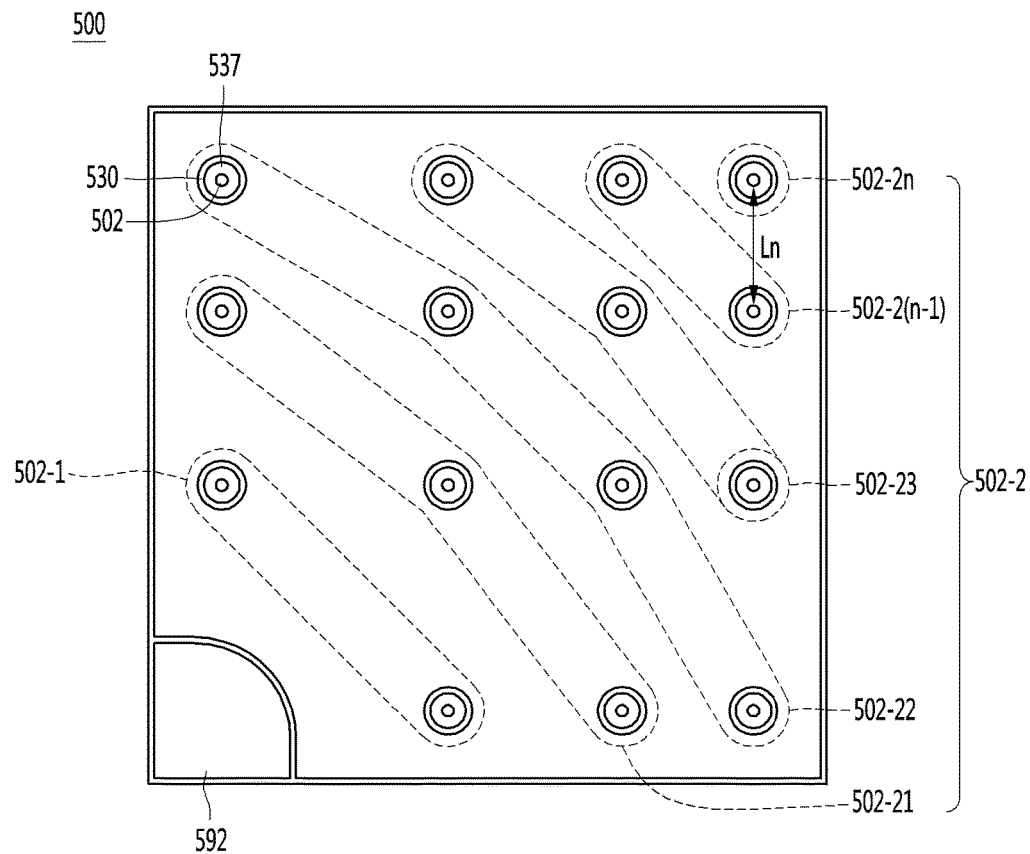
FIG. 20 is a plan view illustrating a semiconductor device according to a fifth embodiment.

FIG. 20 is a plan view illustrating a semiconductor device according to a fifth embodiment. Here, a case where the semiconductor device according to the fifth embodiment has one pad will be described. Also, since configurations except for intervals between a plurality of recesses of the semiconductor device according to the fifth embodiment are the same as the semiconductor device according to the fourth embodiment, the configurations will be described with reference to FIG. 17.

The semiconductor device according to the fifth embodiment may include the light emitting structure 410 including the first conductive semiconductor layer 411, the second conductive semiconductor layer 413, the active layer 412 arranged between the first conductive semiconductor layer 411 and the second conductive semiconductor layer 413, and the plurality of recesses extending from the second conductive semiconductor layer 411 via the active layer 412 to the part of the first conductive semiconductor layer 411, the second electrodes 481 arranged inside the plurality of recesses and electrically connected to the second conductive semiconductor layer 413, the first electrodes 433 electrically connected to the first conductive semiconductor layer 411, and a pad 592 electrically connected to the second electrodes 481, in which a first group of recesses 502-1 among the plurality of recesses are arranged to be adjacent to the pad 592 in a first direction D1 and in a second direction D2 that is perpendicular to the first direction D1 at a first interval L1, and a second group of recesses 502-2 among the plurality of recesses may be arranged in a third direction D3 between the first direction D1 and the second direction D2 in the first group of recesses 502-1 at an interval that is smaller than the first interval L1. Here, since configurations except for intervals between the plurality of recesses of the semiconductor device according to the fifth embodiment are the same as the semiconductor device according to the first embodiment, description thereof will be omitted.

As illustrated in FIG. 5, the pad 592 may be arranged to be adjacent to one edge of the semiconductor device 500. The plurality of recesses 502 may include multiple groups of recesses. The multiple groups of recesses may be increased at regular intervals as they become closer to the pad 592.

A first group of recesses 502-1 may include a plurality of recesses forming a first interval L1. The first group of recesses 502-1 may include a plurality of recesses arranged to be adjacent to the pad 592 in the first direction D1 and the second direction D2. The first group of recesses 502-1 may be spaced apart from the pad 592 in the third direction D3.

A second group of recesses 502-2 may be spaced apart from the first group of recesses 502-1 in the third direction D3. The second group of recesses 402-2 may be spaced apart from the first group of recesses 402-1 by an interval that is smaller than the first interval L2.

The second group of recesses 502-2 may include a 2-1 group of recesses 502-21 adjacent to the first group of recesses 502-1 to a 2-n group of recesses 502-2n. The 2-n group of recesses 502-2n may be a group of recesses furthest away from the first group of recesses 502-1. An interval Ln between the 2-n group of recesses 502-2n and a 2-(n−1) group of recesses 502-(2n−1) may be 1/5 to 1/7 of the first interval L1.

In the semiconductor device according to the fifth embodiment, an interval between the recesses arranged in the third direction D3 from the pad 592 is determined with respect to the first interval L1, so that the group of recesses may be properly arranged.

Unlike the semiconductor device according to the fourth embodiment, the semiconductor device according to the fifth embodiment includes one pad. Thus, the interval between the recesses arranged in the third direction is controlled, so that a current may be effectively prevented from being focused on a recess adjacent to the pad.

Figure 21:
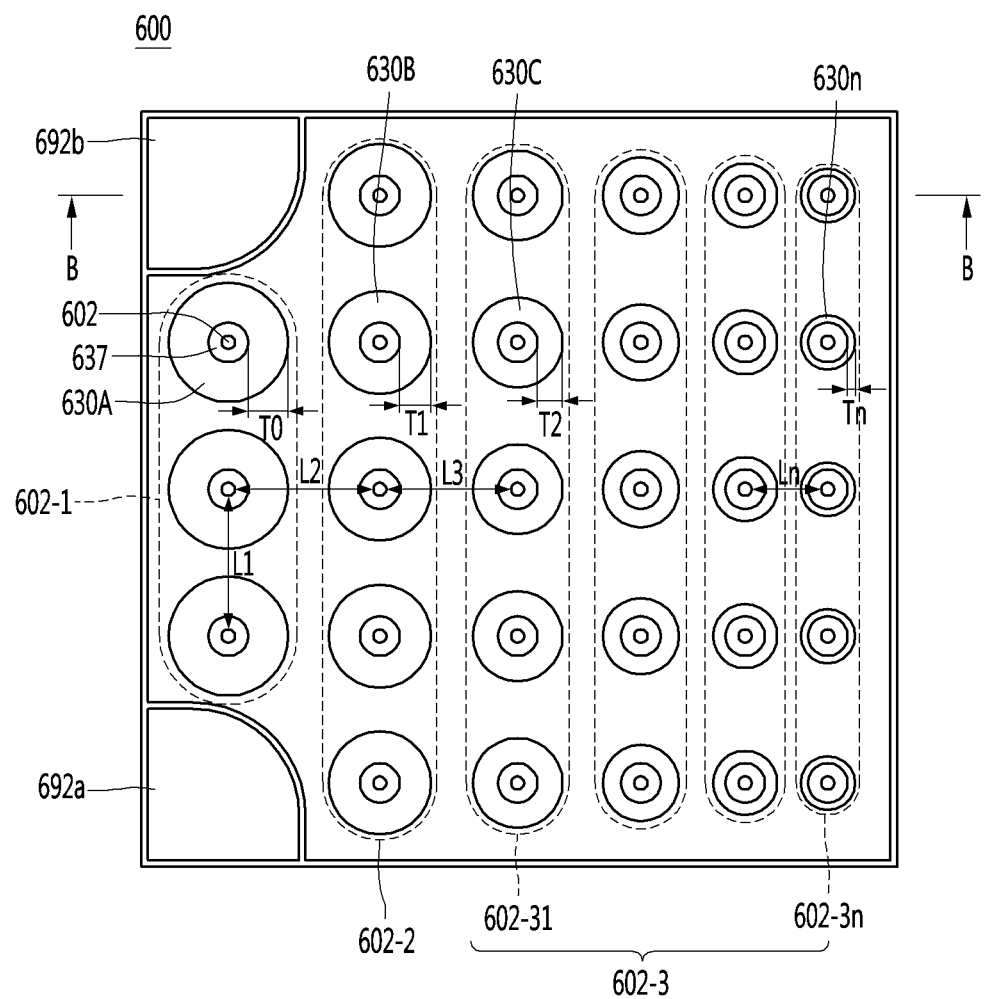
FIG. 21 is a plan view illustrating a semiconductor device according to a sixth embodiment.
Figure 22:
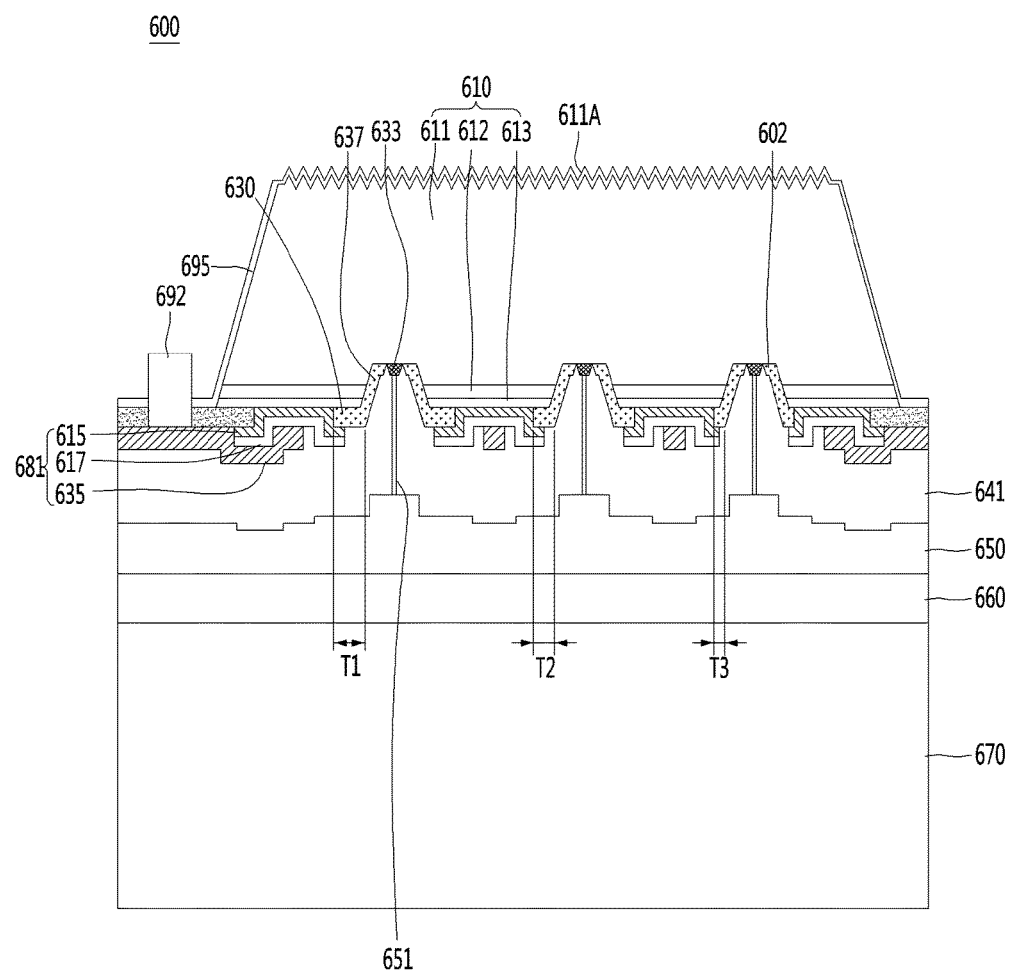
FIG. 22 is a sectional view illustrating the semiconductor device taken along line B-B' of FIG. 21.

FIG. 21 is a plan view illustrating a semiconductor device according to a sixth embodiment, and FIG. 22 is a sectional view illustrating the semiconductor device taken along line B-B' of FIG. 21. Here, for convenience of description, only three recesses of FIG. 21 will be illustrated in FIG. 22.

Referring to FIGS. 21 and 22, a semiconductor device 600 according to the sixth embodiment may include a light emitting structure 610 including a first conductive semiconductor layer 611, an active layer 612, and a second conductive semiconductor layer 613, second electrodes 681 electrically connected to the second conductive semiconductor layer 613, first electrodes 633 electrically connected to the first conductive semiconductor layer 611, and a pad portion 692 electrically connected to the second electrodes 681. Here, since configurations except for intervals between recesses and the thicknesses of current blocking layers are the same as those of the semiconductor device according to the fourth embodiment, description thereof will be omitted.

As illustrated in FIG. 21, the plurality of recesses may include multiple groups of recesses. The multiple groups of recesses 402 may be arranged such that intervals between the recesses 402 become smaller as the recesses 402 become farther away from the pad portion 692.

A first group of recesses 602-1 may include a plurality of recesses formed between a first pad 692a and a second pad 692b. The first group of recesses 602-1 may be spaced apart from each other between the first pad 692a and the second pad 692b at a first interval L1 in a first direction D1 connecting the first pad 492a and the second pad 692b.

A second group of recesses 602-2 may be spaced apart from the first group of recesses 602-1 by a second interval L2 in a second direction D2. The second direction D2 may be perpendicular to the second direction D1, and the second direction D2 may be a direction further away from the pad portion 692. The second interval L2 may be larger than the first interval L1. Although the second group of recesses 602-2 may be arranged at the same interval as the first interval D1, the present disclosure is not limited thereto.

A third group of recesses 602-3 may be spaced apart from the second group of recesses 602-2 by a third interval L3 in the second direction D2. The third group of recesses 602-3 are further away from the pad portion 692 than the second group of recesses 602-2. The third interval L3 may be smaller than the first interval L1.

The third group of recesses 602-3 may include multiple groups of recesses. The third group of recesses 602-3 may include a 3-1 group of recesses 602-31 adjacent to the second group of recesses 602-2 to a 3-n group of recesses 602-3$n$ furthest from the second group of recesses 602-2. The intervals between the third group of recesses 602-3$n$ may increase at regular intervals as they become closer to the pad portion 692.

An interval Ln between the 3-n group of recesses 602-3$n$ arranged to be furthest from the pad portion 692 and a 3-(n−1) group of recesses adjacent to the 3-n group of recesses 602-3$n$ among the third group of recesses 602-3 may be fixed constantly. For example, an interval L1 between the 3-n group of recesses 602-3$n$ and the 3-(n−1) group of recesses may be 1/5 to 1/7 of the first interval L1.

The current blocking layers 630 may be arranged to surround the plurality of recesses. The current blocking layers 630 may include a first group of current blocking layers 630A surrounding the first group of recesses 602-1, a second group of current blocking layers 630B surrounding the second group of recesses 602-2, and a third group of current blocking layers 630C surrounding the third group of recesses 602-3. The thicknesses of the current blocking layers 630 may become larger at regular intervals as they become closer to the pad portion 692. Here, the thickness of each of the current blocking layers 630 may be defined as an interval between one side of a lower portion vertically overlapping with the second conductive semiconductor layer 613 and the other side of the lower portion, not overlapping with the second conductive semiconductor layer 613.

The thickness Tn of a 3-n group of current blocking layers 630$n$ surrounding the 3-n group of recesses 602-3$n$ may be defined as 1/8 to 1/11 of the first interval L1. Accordingly, the thickness of the 3-n group of current blocking layers 630$n$ arranged furthest away from the pad portion 692 may be determined. When the thickness of the 3-n group of current blocking layers 630$n$ is 100%, the thickness of the 3-(n−1) group of current blocking layers 630$n$ may be 93% to 95%. Also, the thickness of the 3-(n−2) group of the current blocking layers may be 86% to 90%.

The semiconductor layer according to the sixth embodiment may prevent a current from being focused on a recess area adjacent to the pad portion 692, by controlling the thicknesses of the current blocking layers 630. In particular, in the semiconductor device according to the sixth embodiment, the thicknesses of the current blocking layers 630 are determined according to distances between the recesses of the semiconductor layer according to the fourth embodiment, so coupling between an electron and a hole may be maximized. Accordingly, light efficiency may be maximized.

Figure 23:
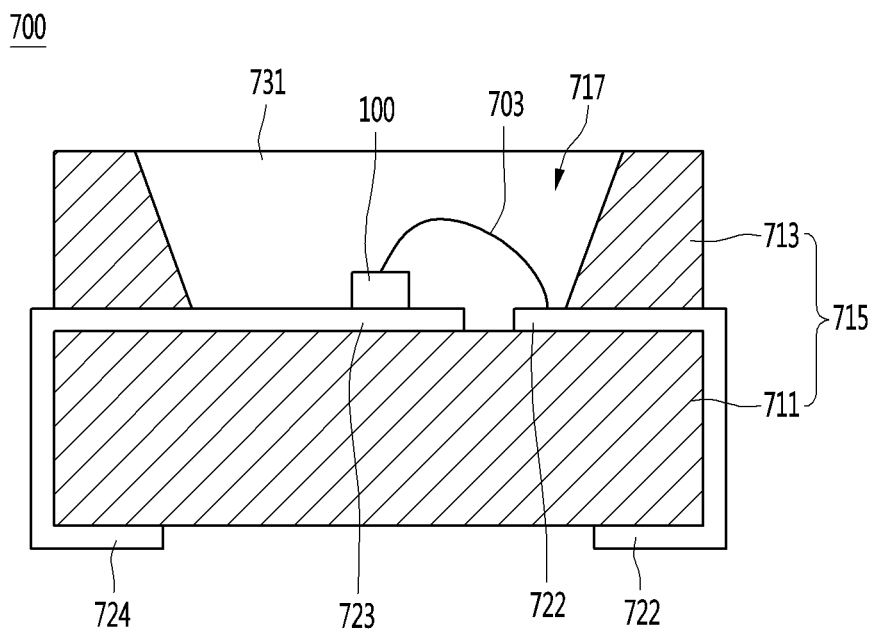
FIG. 23 is a sectional view illustrating a semiconductor package having the semiconductor device according to the first to sixth embodiments provided therein.

FIG. 23 is a sectional view illustrating a semiconductor package having the semiconductor device according to the first to sixth embodiments provided therein.

Referring to FIG. 23, a semiconductor device package 700 includes a body 715, a plurality of lead frames 721 and 723 arranged in the body 715, the semiconductor device 100 according to the embodiment, which is arranged in the body 715 and is electrically connected to the plurality of lead frames 721 and 727, and a molding member 731 covering the semiconductor device 100. Here, the semiconductor device may be any one of the semiconductor devices according to the first to sixth embodiments.

The body 715 includes a conductive substrate such as silicon, a synthetic resin material such as polyphthalamide (PPA), a ceramic substrate, an insulation substrate, or a metal substrate (for example, metal core printed circuit board (MCPCB)). The body 715 may have an inclined surface formed by a cavity 717 around the semiconductor device 100. Also, th outer surface of the body 715 may be formed vertically or to have a slope. Although the body 715 may include a reflective partition wall 713 having the top-opened concave cavity 717 and a support 711 supporting the reflective partition wall 713, the present disclosure is not limited thereto.

The lead frames 721 and 723 and the semiconductor device 100 are arranged inside the cavity 717 of the body 715. The plurality of lead frames 721 and 723 include a first lead frame 721 and a second lead frame 723 spaced apart from each other on the bottom of the cavity 717. The semiconductor device 100 may be arranged on the second lead frame 737 and may be connected to the first lead frame 721 through a connection member 703. The first lead frame 721 and the second lead frame 723 are electrically isolated from each other, and provide electric power to the semiconductor device 100. The connection member 703 may include a wire. Also, the first lead frame 721 and the second lead frame 723 reflect a light beam generated by the semiconductor device 100, thereby increasing light efficiency. To this end, although separate reflective layers may be further formed on the first lead frame 721 and the second lead frame 723, the present disclosure is not limited thereto. Also, the first and second lead frames 721 and 723 may serve to discharge heat generate by the semiconductor device 100 to the outside. A lead portion 722 of the first lead frame 721 and a lead portion 724 of the second lead frame 723 may be arranged on a lower surface of the body 715.

The first and second lead frames 721 and 723 may include metal, for example, at least one of Ti, Cu, Ni, Au, Cr, Ta, Pt, Sn, Ag, and P. Also, although the first and second lead frames 721 and 723 may be formed to have a single layer structure or a multilayer structure, the present disclosure is not limited thereto.

The molding member 731 may include a resin material such as silicone or epoxy, and may surround the semiconductor device 100 to protect the semiconductor device 100. Also, fluorescent materials may be included in the molding member 731 to change the wavelength of a light beam emitted from the semiconductor device 100. The fluorescent materials may be selected from the group consisting of YAG, TAG, Silicate, Nitride, and an Oxy-nitride-based material. The fluorescent materials may include at least one of red fluorescent materials, yellow fluorescent materials, and green fluorescent materials. The upper surface of the molding member 731 may have a flat shape, a concave shape, or a convex shape.

A lens may be arranged on the molding member 731, and the lens may be in contact with or may not be in contact with the molding member 731. The lens may include a concave shape or a convex shape. Although the upper surface of the molding member 731 may have a flat shape, a convex shape, or a concave shape, the present disclosure is not limited thereto.

The above-described semiconductor device is configured by a semiconductor device package, and may be used as a light source of a lighting system. For example, the semiconductor device may be used as a vehicle lamp including a vehicle head lamp or a rear lamp.

Figure 24:
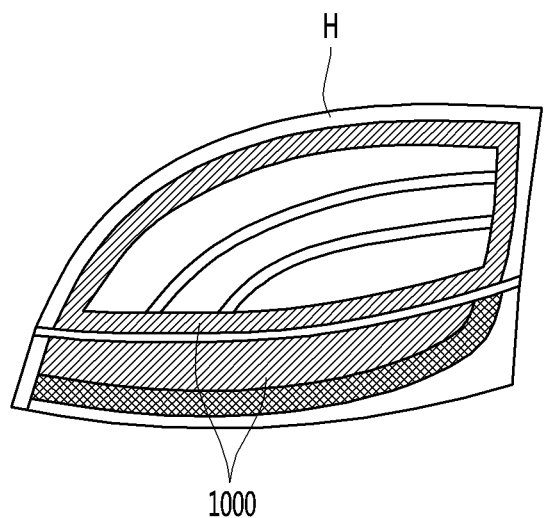
FIG. 24 is a perspective view illustrating a head lamp for a vehicle, which has the semiconductor device according to the first to sixth embodiments provided therein.
Figure 25:
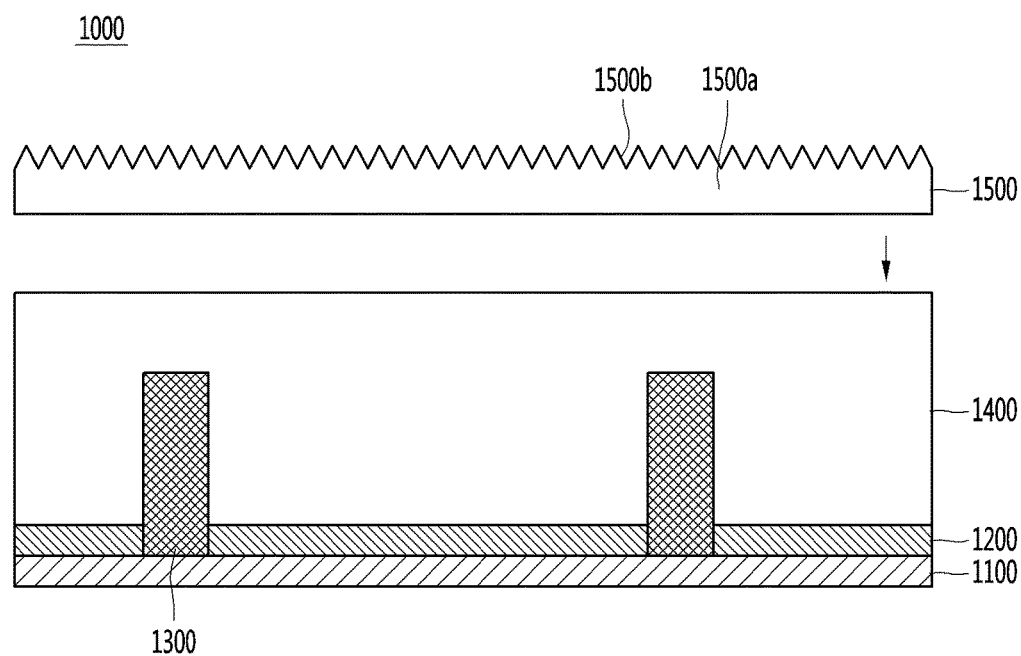
FIG. 25 is a sectional view illustrating a vehicle lamp of FIG. 24.

FIG. 24 is a perspective view illustrating a head lamp for a vehicle, which has the semiconductor device according to the first to sixth embodiments provided therein, and FIG. 25 is a sectional view illustrating a vehicle lamp of FIG. 24. Here, although the vehicle head lamp has been described as an example, the semiconductor device may be also applied to the rear lamp for a vehicle.

As illustrated in FIG. 24, a head lamp for the vehicle basically includes a light housing H and a lighting unit 1000 configured to generate a surface light source. The light housing H may accommodate the lighting unit 1000, and may be formed of a transparent material. The light housing H for the vehicle may include a curve according to a portion of the vehicle in which the light housing H is mounted and a design thereof.

As illustrated in FIG. 25, the lighting unit 1000 may have a structure in which a semiconductor device package 1300 according to an embodiment is mounted on a substrate 1100. The substrate 1100 may be a PCB having a circuit pattern formed on one surface thereof. The substrate 1100 may be formed of a rigid or ductile material.

A light guide member 1400 may be arranged on the semiconductor device package 1300. The light guide member 1400 may be stacked in a structure in which the semiconductor device package 1300 is buried. The light guide member 1400 may be in close contact with the outer surface of the semiconductor device package 1300.

The light guide member 1400 may include a resin layer. The resin layer may be formed of a high heat-resistant UV curable resin including oligomer. Although urethane acrylate may be used as the UV curable resin, the present disclosure is not limited thereto. In addition, at least one of epoxy acrylate, polyester acrylate, polyether acrylate, polybutadiene acrylate, and silicon acrylate may be used as the UV curable resin.

In particular, when the urethane acrylate is used as the oligomer, two types of urethane acrylate are mixed and used, so that different properties may be implemented simultaneously.

The resin layer may further include at least one of a monomer and a photo initiator. Also, the resin layer may be formed of thermosetting resin having high heat resistance. In detail, the resin layer may be formed of thermosetting resin including at least one of polyester polyol resin, acryl polyol resin, a hydrocarbon-based solvent, and/or an ester-based solvent. Such thermosetting resin may further include a heat curing agent to improve film strength.

Although a refractive index of the resin layer may be determined in a range of 1.4 to 1.8, the present disclosure is not limited thereto.

A reflective member 1200 may be further included between the substrate 1100 and the light guide member 1400. The reflective member 1200 is formed on an upper surface of the substrate 1100, and has a structure into which the semiconductor device package 1300 is inserted. Such a reflective member 1200 is formed of a material having high reflection efficiency to reflect a light beam emitted from a light emitting unit 130 to the upper side, thereby reducing loss of light.

The reflective member 1200 may be formed in a film form. A reflective pattern may be formed on a surface of the reflective member 1200, and the reflective pattern serves to evenly transmit a light beam to the upper side by scattering and dispersing the input light beam. Although the reflective pattern may be formed by printing reflective ink including any one of $TiO_2$, $CaCo_3$, $BaSo_4$, $Al_2O_3$, silicon, and PS on the surface of the reflective member 1200, the present disclosure is not limited thereto.

When the semiconductor device package 1300 is buried in the light guide member 1400, a structure becomes simple. Also, in the semiconductor device package 1300, a quantity of light increases due to the light guide member 140 as compared with a case where a light beam is directly discharged to the air, so that light efficiency may be improved.

An optical member 1500 may be arranged above the light guide member 1400.

An inner lens-type member including a optical pattern formed on a surface thereof may be used as the optical member 1500. Th optical member 1500 may increase light efficiency due to an increase in a transmittance of a lens itself, and may implement a design effect through an optical pattern 1500b not only when a light of the vehicle is switched off but also when the light is switched on.

The optical member 1500 and the light guide member 1400 may be spaced apart from each other by a specific distance. When the light beam output from the semiconductor device package 1300 is induced and diffused through the light guide member 1400 and is plane-emitted to the upper side, a light scattering effect may be increased due to existence of an air layer of a separation portion having a refractive index that is different from that of the light guide member 1400. Accordingly, uniformity of the light beam may be increased. As a result, the uniformity of the light beam output from the optical member 1500 may be improved, and uniform plane emission may be implemented.

The optical member 1500 may be formed to have a structure in which an embossed or engraved optical pattern 1500b having directionality is implemented on a surface of a transparent lens member 1500a having high light transmittance.

Also, the above-described semiconductor device is configured by the semiconductor device package, and thus may be used as a light source of an image display device or a light source of a lighting device.

When the semiconductor device is used as a backlight unit of the image display device, the semiconductor device may be used as an edge-type backlight unit or a direct-type backlight unit, and when the semiconductor device is used as the light source of the lighting device, the semiconductor device may be also used as a lamp or a bulb. Also, the semiconductor device may be also used as a light source of a mobile terminal.

The semiconductor device may be a laser diode in addition to the above-described light emitting diode.

Like the semiconductor device, the laser diode may include the first conductive semiconductor layer, the active layer, and the second conductive semiconductor layer, which have the above-described structures. Further, after the p-type first conductive semiconductor and the n-type second conductive semiconductor are joined to each other, when a current flows thereto, an electro-luminescence phenomenon in which a light beam is emitted is used. However, directionality and a phase of the emitted light beam are different. That is, the laser diode may emit a light beam having one specific wavelength at the same phase and in the same direction using a stimulated emission phenomenon and a constructive interference phenomenon, and may be used as optical communication, medical equipment, semiconductor process equipment, and the like due to such characteristics.

A photodetector which is a kind of transducer configured to detect a light beam and convert an intensity thereof into an electric signal may be described as an example of a light receiving element. Although the photodetector may include a photocell (silicon photocell and selenium photocell), a photoconductive element (cadmium sulfide photoconductive element and cadmium selenide photoconductive element), a photodiode (for example, a photodiode having a peak wavelength in a visible blind spectral region or a true blind spectral region), a photo transistor, an photomultiplier, a phototube (vacuum phototube and gas-filled phototube), an infrared ray detector, and the like, the embodiment is not limited thereto.

Also, the semiconductor device such as the photodetector may be generally manufactured using a direct energy gap semiconductor having excellent photoconversion efficiency. Alternatively, the photodetector has various structures, and includes, as the most general structure, a pin-type photodetector using p-n junction, a schottky photodetector using schottky junction, a metal semiconductor metal (MSM)-type photodetector, and the like.

Like the light emitting element, the photodiode may include the first conductive semiconductor layer, the active layer, and the second conductive semiconductor layer, which have the above-described structures, and is implemented by pn junction or a pin structure. The photodiode operates by applying a reverse bias or a zero bias, and hen a light beam is input to the photodiode, an electron and a hole are generated so that a current flows. At this time, the magnitude of the current may be in proportional to the intensity of the light beam input to the photodiode.

The photocell or a solar cell, which is a kind of photodiode, may convert a light beam into a current. Like the light emitting element, the solar cell may include the first conductive semiconductor layer, the active layer, and the second conductive semiconductor layer, which have the above-described structures.

Also, the solar cell may be also used as a rectifier of an electronic circuit through rectification characteristics of a general diode using p-n junction, and may be applied to a high frequency circuit, an oscillation circuit, and the like.

Also, the above-described semiconductor device is not necessarily implemented only as a semiconductor, and in some cases, the semiconductor device may further include metal. For example, the semiconductor device such as the light receiving element may be implemented using at least one of Ag, Al, Au, In, Ga, N, Zn, Se, P, and As, and may be implemented using a semiconductor material doped with a p-type dopant or an n-type dopant or an intrinsic semiconductor material. Although the embodiments have been mainly described above, the embodiments are merely illustrative and do not limit the present disclosure. Further, it will be apparent to those skilled in the art to which the present disclosure pertains that various modifications and applications may be conceived without departing from the essential feature of the present embodiment. For example, components described in the embodiments in detail may be implemented by modification. Further, it should be interpreted that differences related to the modifications and the applications are included in the scope of the present disclosure, which is defined by the appended claims.

What is claimed is:

1. A semiconductor device comprising:
    a light emitting structure including a first conductive semiconductor layer, an active layer under the first conductive semiconductor layer, a second conductive semiconductor layer under the active layer, and a plurality of recesses through which a lower portion of the first conductive semiconductor layer is exposed;
    at least one pad arranged outside the light emitting structure, and arranged to be adjacent to at least one edge; and
    a plurality of insulation patterns arranged inside the recesses and extending to a lower surface of the light emitting structure,
    wherein widths of the plurality of insulation patterns are reduced as the insulation patterns become further away from the pad,
    wherein the pad includes a first pad arranged to be adjacent to a first edge and a second pad arranged to be adjacent to a second edge, and
    wherein widths of the plurality of insulation patterns are reduced as the insulation patterns go from the first edge toward a third edge in a diagonal direction.

2. The semiconductor device of claim 1, wherein the plurality of insulation patterns include first to sixth insulation patterns, and
    wherein the first to sixth insulation patterns are arranged from the first edge adjacent to the first pad toward the third edge.

3. The semiconductor device of claim 2, wherein when a width of the first insulation pattern is 100%, a width of the sixth insulation pattern is 65% or more.

4. The semiconductor device of claim 2, wherein when a width of the first insulation pattern is 100%, a width of the second insulation pattern is 93% to 95%, a width of the third insulation pattern is 86% to 90%, a width of the fourth insulation pattern is 79% to 85%, a width of the fifth insulation pattern is 72% to 80%, and a width of the sixth insulation pattern is 65% to 75%.

5. The semiconductor device of claim 1, wherein the plurality of recesses are arranged on the light emitting structure at regular intervals, and the plurality of recesses have a constant width, and
    wherein the semiconductor device further comprises second electrodes arranged inside the plurality of recesses and being directly in contact with the first conductive semiconductor layer exposed from the recesses.

6. The semiconductor device of claim 5, wherein the plurality of insulation patterns surround the second electrodes, and intervals between the plurality of adjacent insulation patterns become larger as the insulation patterns become further away from the pad.

7. The semiconductor device of claim 1, wherein the plurality of insulation patterns include first to sixth insulation patterns, and
wherein when a first interval between the first insulation pattern adjacent to the pad and the second insulation pattern is 100%, a second interval between the second and third insulation patterns is 94% to 97%, a third interval between the third and fourth insulation patterns is 91% to 94%, a fourth interval between the fourth and fifth insulation patterns is 88% to 91%, a fifth interval between the fifth and sixth insulation patterns is 85% to 88%.

8. The semiconductor device of claim 1, wherein the widths of the plurality of insulation patterns are reduced as the insulation patterns go from the second edge toward a fourth edge in a diagonal direction.

9. A semiconductor device comprising:
a light emitting structure including a first conductive semiconductor layer, a second conductive semiconductor layer, an active layer arranged between the first conductive semiconductor layer and the second conductive semiconductor layer, and a plurality of recesses extending from the second conductive semiconductor layer via the active layer to a part of the first conductive semiconductor layer;
first electrodes arranged inside the plurality of recesses and electrically connected to the first conductive semiconductor layer;
second electrodes electrically connected to the second conductive semiconductor layer; and
a pad portion including a first pad and a second pad electrically connected to the second electrodes,
wherein a first group of recesses among the plurality of recesses are spaced apart from each other between the first pad and the second pad by a first interval in a first direction connecting the first pad and the second pad,
wherein a second group of recesses among the plurality of recesses are arranged in the first direction to be spaced apart from each other by a second interval that is larger than the first interval in a second direction that is perpendicular to the first direction in the first group of recesses, and
wherein a third group of recesses among the plurality of recesses are arranged in the first direction to be spaced apart from each other by a third interval that is smaller than the first interval in the second direction in the second group of recesses.

10. The semiconductor device of claim 9, wherein the third group of recesses include a 3-1 group of recesses adjacent to the second group of recesses to a 3-n group of recesses furthest away from the second group of recesses, and intervals between the second group of recesses to the 3-n group of recesses are increased at regular intervals as the recesses become closer to the pad portion.

11. The semiconductor device of claim 10, wherein an interval between the 3-n group of recesses and the 3-(n−1) group of recesses is determined by an equation, $$Ln = \beta L1,$$

wherein $\beta$ is an arbitrary experimental value, and L1 is the first interval.

12. The semiconductor device of claim 10, wherein an interval between the 3-n group of recesses and the 3-(n−1) group of recesses is 1/5 to 1/7 of the first interval.

13. The semiconductor device of claim 10, wherein the semiconductor device further comprises current blocking layers surrounding the plurality of recesses, and thicknesses of the current blocking layers become larger as the current blocking layers become closer to the pad portion.

14. The semiconductor device of claim 13, wherein a thickness of the current blocking layer arranged to be furthest away from the pad portion is 1/5 to 1/11 of the first interval.

15. The semiconductor device of claim 9, wherein the second interval is 1.25 times to 1.35 times of the first interval.

16. The semiconductor device of claim 9, wherein the second interval is determined by an equation, $$L2 = \alpha L \times \beta L1 (\alpha = 1.4 \sim 1.5, \beta = 1/5 \sim 1/7),$$

wherein L is the first interval.

17. A semiconductor device comprising:
a light emitting structure including a first conductive semiconductor layer, a second conductive semiconductor layer, an active layer arranged between the first conductive semiconductor layer and the second conductive semiconductor layer, and a plurality of recesses extending from the second conductive semiconductor layer via the active layer to a part of the first conductive semiconductor layer;
first electrodes arranged inside the plurality of recesses and electrically connected to the first conductive semiconductor layer;
second electrodes electrically connected to the second conductive semiconductor layer; and
a pad electrically connected to the second electrodes,
wherein a first group of recesses among the plurality of recesses are arranged to be adjacent to the pad in a first direction and a second direction that is perpendicular to the first direction at a first interval, and
wherein a second group of recesses among the plurality of recesses are arranged in a third direction between the first direction and the second direction at an interval that is smaller than the first interval in the first group of recesses.

18. The semiconductor device of claim 17, wherein the second group of recesses include a 2-1 group of recesses adjacent to the first group of recesses to a 2-n group of recesses furthest away from the first group of recesses, and intervals between the second group of recesses are increased at regular intervals as the second group of recesses become closer to the pad.

19. The semiconductor device of claim 18, wherein an interval between the 2-n group of recesses and the 2-(n−1) group of recesses is 1/5 to 1/7 of the first interval.

* * * * *